(12) United States Patent
Kawanabe et al.

(10) Patent No.: US 7,049,214 B2
(45) Date of Patent: May 23, 2006

(54) METHOD OF MANUFACTURING A SEMICONDUCTOR DEVICE TO PROVIDE IMPROVED ADHESION BETWEEN BONDING PADS AND BALL PORTIONS OF ELECTRICAL CONNECTORS

(75) Inventors: Naoki Kawanabe, Kodaira (JP); Tomoo Matsuzawa, Tokyo (JP); Toshiaki Morita, Hitachi (JP); Takafumi Nishita, Iruma (JP)

(73) Assignee: Renesas Technology Corp., Tokyo (JP)

( * ) Notice: Subject to any disclaimer, the term of this patent is extended or adjusted under 35 U.S.C. 154(b) by 218 days.

(21) Appl. No.: 10/807,249

(22) Filed: Mar. 24, 2004

(65) Prior Publication Data
US 2005/0035449 A1    Feb. 17, 2005

(30) Foreign Application Priority Data
Mar. 31, 2003    (JP) .............................. 2003-093421

(51) Int. Cl.
*H01L 21/44* (2006.01)
(52) U.S. Cl. ...................... 438/612; 438/613
(58) Field of Classification Search ........ 438/612–613, 438/617
See application file for complete search history.

(56) References Cited

U.S. PATENT DOCUMENTS 5,891,796 A * 4/1999 Nakamura et al. .......... 438/617
6,815,260 B1 * 11/2004 Ino ............................ 438/125

FOREIGN PATENT DOCUMENTS

JP      07-335886    12/1995
JP      08-127828     5/1996

\* cited by examiner

*Primary Examiner*—Phat X. Cao
*Assistant Examiner*—Theresa T. Doan
(74) *Attorney, Agent, or Firm*—Antonelli, Terry, Stout and Kraus, LLP.

(57) ABSTRACT

A method is provided to improve the adhesion between bonding pads and ball portions of gold wires to improve the reliability of a semiconductor device. About 1 wt. % of Pd is contained in gold wires for connection between electrode pads formed on a wiring substrate and electrode pads (exposed areas of a top layer wiring formed mainly of Al) formed on a semiconductor chip. In bonded portions between the electrode and ball portions of the gold wires, an interdiffusion of Au and Al is suppressed to prevent the formation of $Au_4Al$ after PCT (Pressure Cooker Test). Thus, a desired bonding strength is obtained even when the pitch of the electrode pads is smaller than 65 μm and the diameter of the ball portion is smaller than 55 μm or the diameter of the wire portion of each gold wire is not larger than 25 μm.

13 Claims, 21 Drawing Sheets

METHOD OF MANUFACTURING A SEMICONDUCTOR DEVICE TO PROVIDE IMPROVED ADHESION BETWEEN BONDING PADS AND BALL PORTIONS OF ELECTRICAL CONNECTORS

CROSS-REFERENCE TO RELATED APPLICATION

The present application claims priority from Japanese patent application JP 2003-093421, filed on Mar. 31, 2003, the content of which is hereby incorporated by reference into this application.

BACKGROUND OF THE INVENTION

The present invention relates to a method of manufacture of a semiconductor device. Particularly, the present invention is concerned with a technique applicable in the manufacture of a semiconductor device wherein a semiconductor chip and a wiring substrate are connected together using wire.

For allowing an IC (Integrated Circuit) chip to function, it is necessary to draw out electrical signal input and output portions to the exterior. To meet this requirement, there is known a packaging method wherein bonding pads on an IC chip (a semiconductor chip) and terminals for external connection, which are formed on a wiring substrate, are connected together using gold wires (bonding wires) and thereafter the IC chip and the gold wires are sealed with resin.

In such a packaging method, it is important to ensure a sufficient bonding strength between the gold wires and the bonding pads.

For example, Patent Literature 1 (Japanese Unexamined Patent Publication No. Hei 8(1996)-127828) discloses a technique wherein, in order to obtain a predetermined shear strength even at a reduced bonding area (bonding diameter), a thin wire is formed using a master alloy containing high purity gold and Pd (palladium) or Pt (platinum).

Patent Literature 2 (Japanese Unexamined Patent Publication No. Hei 7(1995)-335686) discloses a technique wherein gold having a purity of 99.995% or more is used as a material of a thin gold alloy wire for wire bonding and a metal such as Ca or Be is incorporated therein to improve the Young's modulus, and further, in addition to silver and copper, Pd or Pt is incorporated therein, where required, to improve the bonding strength.

SUMMARY OF THE INVENTION

The present inventors are engaged in the research and development of semiconductor devices and employ a semiconductor device mounting method using the foregoing gold wire and resin.

For example, one of the ends of the gold wires are melted and thermocompression-bonded (first bonding) under the application of ultrasonic waves onto bonding pads formed as exposed portions on an Al film (Al wiring), which is formed as a top layer of an IC chip, to thereby bond the IC chip and the gold wires. Opposite ends of the gold wires are thermocompression-bonded (second bonding) under the application of ultrasonic waves onto external connection terminals formed on a wiring substrate. Further, the IC chip and the gold wires are sealed with resin, for example, to complete a package.

In such a packaging method, an alloy of Al and Au is formed in the bonding pads, whereby the Al film and the tips (ball portions) of the gold wires are connected together.

On the other hand, with the recent tendency to multiple functions of the LSI (Large Scale Integrated Circuit), not only is the number of bonding pads (pins) increasing, but also the pitch thereof is becoming narrower, and the area of each bonding pad tends to decrease. For connecting a gold wire to a bonding pad of small area, it is necessary to use a thinner gold wire.

With microstructurization of an LSI, there sometimes is a case where it is required to thin the AL film that is formed as the top layer. Conversely, there is a case where the top Al film should be formed to be thick in order to attain a low resistance in the power supply wiring.

Further, for preventing strain in a wiring substrate with a chip mounted thereon, or in case of using a resin substrate (e.g., a glass fabric-based epoxy resin substrate or a polyimide resin film) as a wiring substrate, it is necessary to lower the bonding temperature in order to prevent degassing caused by heat during wire bonding.

The present inventors have made studies to meet such various requirements as referred to above. As a result, a breaking of wire occurred in a PCT (Pressure Cooker Test), as will be explained later in more detail.

It is an object of the present invention to improve the adhesion between bonding pad portions and ball portions.

It is another object of the present invention to improve the reliability of a semiconductor device by improving the adhesion between bonding pad portions and ball portions.

It is a further object of the present invention to improve the manufacturing yield of a semiconductor device.

The above objects and novel features of the present invention will become apparent from the following description and the accompanying drawings.

The following is a brief description of typical modes of the present invention as disclosed herein.

A semiconductor device according to the present invention comprises (a) a semiconductor chip having on a main surface thereof a plurality of first electrode pads formed as exposed areas of a metallic film which contains aluminum (Al) as a main component, (b) a wiring substrate onto which the semiconductor chip is mounted and which has a plurality of second electrode pads formed on a main surface thereof, and (c) electrically conductive wires for connecting the first and second electrode pads with each other, the electrically conductive wires containing gold (Au) as a main component and comprising ball portions formed on the first electrode pads, bonded portions formed on the second electrode pads, and wire portions for connecting the ball portions and the bonded portions with each other, the ball portions being bonded to the first electrode pads through an alloy layer of Al and Au, wherein (d) palladium (Pd) is contained in the electrically conductive wires, and (e) the distance between central positions of the adjacent first electrode pads is shorter than 65 μm. The diameter of a maximum external form of each of the ball portions may be set to be smaller than 55 μm. The diameter of each of the wire portions may be set at a value of not larger than 25 μm. The thickness of the metallic film may be set at a value of not smaller than 1000 nm. Further, the thickness of the metallic film may be set at a value of not larger than 400 nm.

A method of manufacturing a semiconductor device according to the present invention comprises the steps of (a) providing a wiring substrate having a plurality of second electrode pads formed on a main surface thereof, (b) mounting a semiconductor chip on the wiring substrate, the semiconductor chip having on a main surface thereof a plurality of first electrode pads formed as exposed areas of a metallic film which contains aluminum (Al) as a main component, and (c) connecting the first electrode pads and the second electrode pads with each other through electrically conductive wires which contain gold (Au) as a main component, the step (c) comprising the steps of (c1) melting, on the first electrode pads, one of the ends of the electrically conductive wires and bonding the resulting melted balls onto the first electrode pads, (c2) bonding opposite ends of the electrically conductive wires onto the second electrode pads, and (c3) thereby forming the electrically conductive wires having ball portions formed on the first electrode pads, bonded portions formed on the second electrode pads, and wire portions for connecting the ball portions and the bonded portions with each other, the ball portions being bonded to the first electrode pads through an alloy layer of Al and Au, wherein (d) palladium (Pd) is contained in the electrically conductive wires, and (e) the step (c) is carried out in a state in which the temperature of the main surface of the semiconductor chip is not higher than 200° C.

DETAILED DESCRIPTION OF THE PREFERRED EMBODIMENTS

Preferred embodiments of the present invention will be described in detail in conjunction with the attached drawings. In all of the drawings, the same symbols are applied to identical parts, and a repeated explanation thereof is omitted.

First Embodiment

Figure 1:
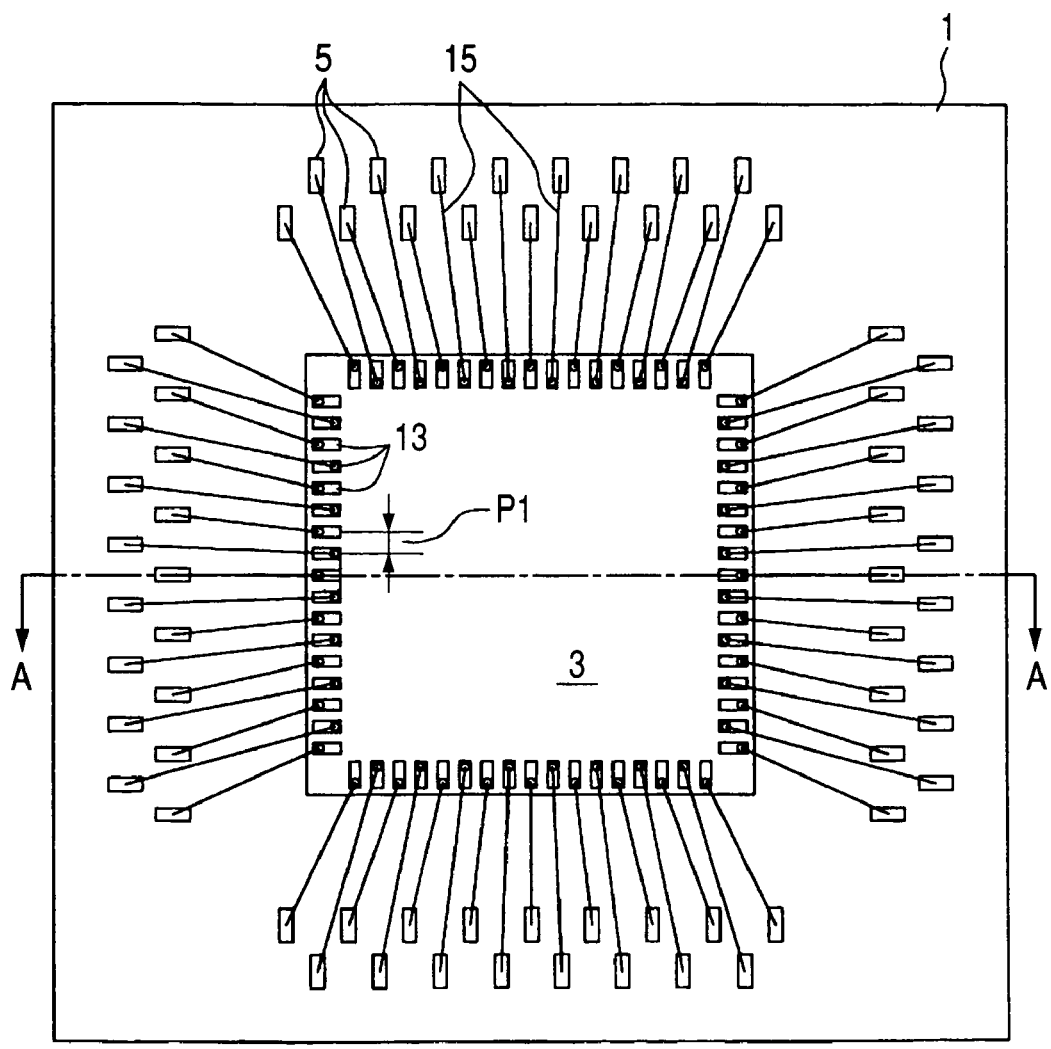
FIG. 1 is a plan view of a principal portion of a semiconductor device according to a first embodiment of the present invention.
Figure 2:
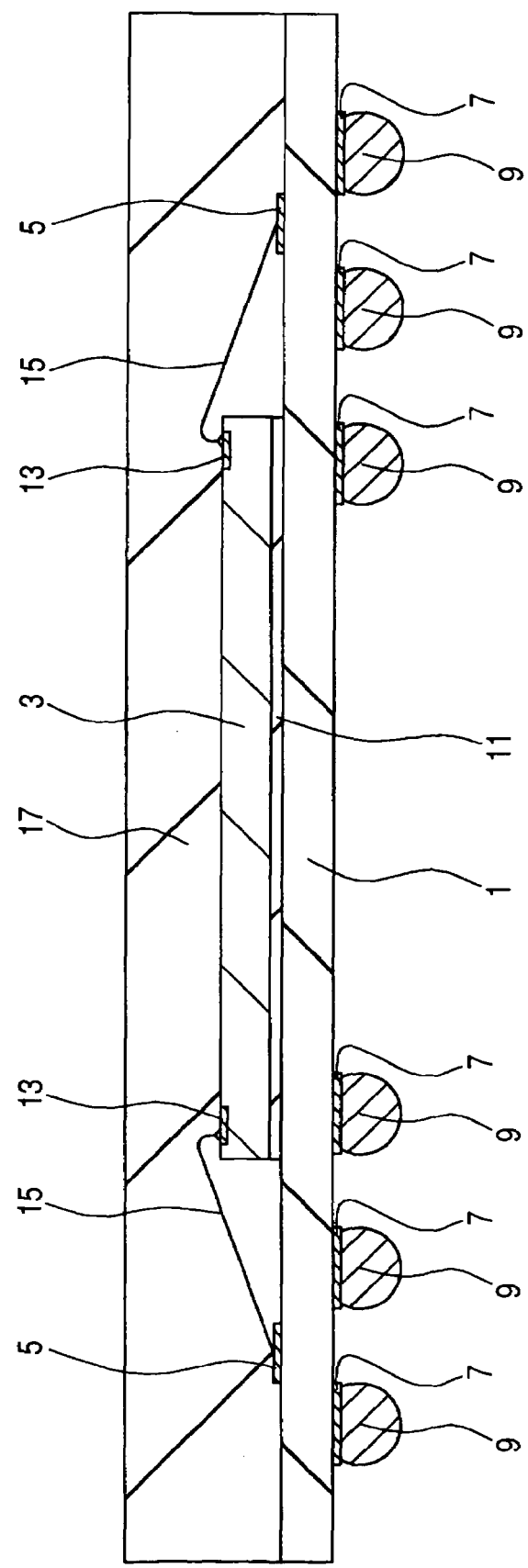
FIG. 2 is a sectional view taken along line A—A in FIG. 1.

A semiconductor device according to this first embodiment will be described hereinunder with reference to FIGS. 1 and 2, of which FIG. 1 is a plan view of a principal portion of the semiconductor device, and FIG. 2 is a sectional view thereof, which corresponds, for example, to a section taken on line A—A in FIG. 1.

As shown in FIGS. 1 and 2, a semiconductor chip 3 is mounted on a wiring substrate 1. The wiring substrate 1 comprises a core portion, as well as a front surface and a back surface thereof. On the front surface of the wiring substrate 1, there are plural electrode pads 5, and the other area than that occupied by the electrode pads 5 is covered with an insulating film (protective film). On the back surface there are electrode pads 7, and on the electrode pads 7 bump electrodes 9 are formed by solder, for example. The area other than that occupied by the electrode pads 7 is also covered with an insulating film (protective film).

The core portion has a stacked structure of plural resin substrates each having a surface on which wiring of copper, for example, is formed. The bump electrodes 9 and the electrode pads 5 are connected together through the wirings formed on the stacked layers and further through interlayer via holes (connections).

The resin substrates which constitute the core portion are highly elastic resin substrates comprising, for example, glass fibers impregnated with an epoxy resin. Such a substrate, or a wiring substrate having such a substrate, is called a glass fabric-based epoxy resin substrate. The protective film formed on the front surface and the back surface of the wiring substrate 1 is formed, for example, using a two-liquid alkali developer type solder resist ink or a thermosetting type one-liquid solder resist ink. The electrode pads 5 and 7 are exposed portions of wiring formed of Cu for example.

The wiring substrate 1 has, for example, a square shape of 13 mm×13 mm, and the electrode pads 5 are formed in two rows along each side of the substrate. The electrode pads 5 thus formed in two rows are arranged in a zigzag fashion. The bump electrodes 9 (electrode pads 7) are arranged area by area on the back surface of the wiring substrate 1.

The wiring substrate 1 plays the role of an interposer at the time of mounting the semiconductor chip onto a mother board.

The semiconductor chip 3 is fixed onto the wiring substrate 1 with the use of an adhesive 11. The semiconductor chip 3 has a semiconductor element, an insulating film and wiring formed on a semiconductor substrate, and on a main surface (element-forming surface) there are plural electrode pads (also called "bonding pads" or merely "pads") 13. The electrode pads are exposed areas of a top layer wiring (metallic film) formed of aluminum (Al), for example. The film thickness of the top layer wiring is 2000 nm or so, for example. The other area than the electrode pads 13 is covered with an inorganic insulating film, such as a laminate of silicon oxide film and silicon nitride film, or an organic insulating film, such as a polyimide resin film. As the material of the top layer wiring, an Al alloy may be used.

The semiconductor chip 3 has, for example, a square shape of 5 mm×5 mm, and the electrode pads 13 are formed along each side of the semiconductor chip. The pitch of the electrode pads 13 is 50 µm or so, for example. The pitch as referred to herein indicates the distance P1 between central positions of adjacent electrode pads 13.

The electrode pads 5 on the wiring substrate 1 and the electrode pads 13 on the semiconductor chip 3 are electrically connected with each other through wires ("gold wires" hereinafter) 15, which are formed of an electrically conductive material, such as gold (Au).

The gold wires 15 each comprise 99.99% (4N) of gold and Pd (palladium) incorporated therein. The concentration of Pd is 1 wt. % (weight percent) or so and that of gold is about 99%.

The connection (first bonding) between the electrode pads 5 and 13 through the gold wires 15 is performed by nail head bonding. This bonding step comprises passing gold wire through a wire bonding tool called a capillary, which has a central hole for the passage of the gold wire therethrough, then melting the tip of the gold wire by means of an electric torch or the like to make it into a ball shape, placing the tip of the ball onto the associated electrode pad 13 on the semiconductor chip, applying a certain load to the ball by the capillary, and allowing a partial heat-fusion to occur to effect bonding. During the bonding, ultrasonic energy is applied to the capillary.

This bonding method is called a nail head bonding method because it looks as if the bonding were conducted at the head portion of an inverted nail.

Thereafter, the gold wire 15 is pulled onto the associated electrode pad 15 and is heat-fused onto the electrode pad under the application of ultrasonic waves and is thereafter cut off (second bonding). During this bonding step, the semiconductor chip 3 and the wiring substrate 1 are continuously heated by a heat block. As to the bonding step, it will be described later in more detail in connection with an explanation on the manufacturing method.

Figure 3:
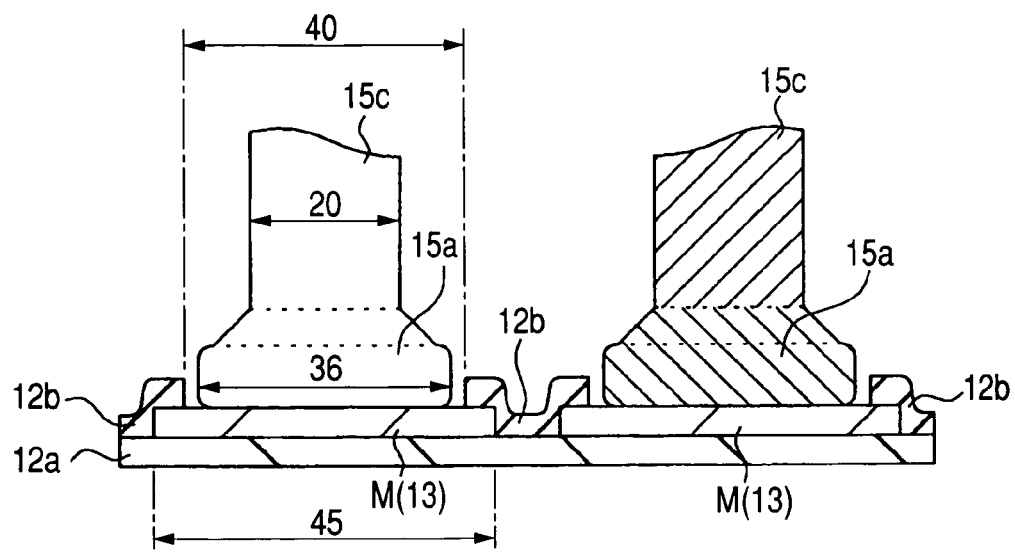
FIG. 3 is a partial enlarged sectional view taken along line B—B in FIG. 4.
Figure 6:
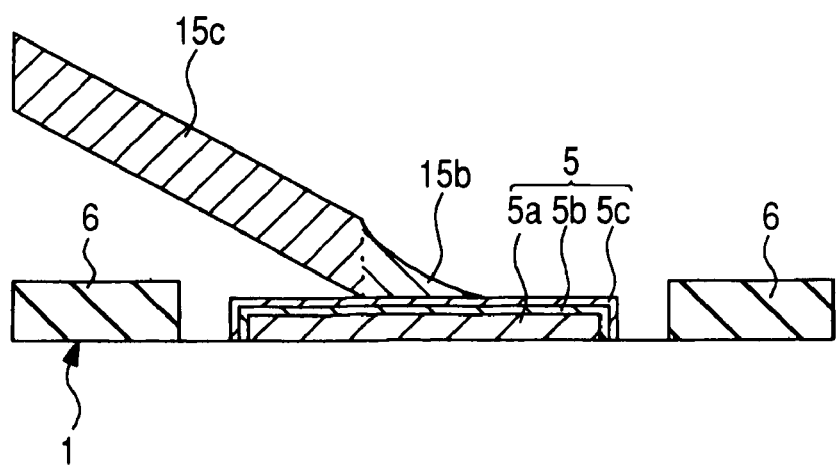
FIG. 6 is an enlarged sectional view taken along line C—C in FIG. 7.

Thus, the gold wire 15 comprises a ball portion 15a positioned on the associated electrode pad 13, a bonded portion (compression-bonded portion) 15b formed on the associated second electrode pad, and a wire portion 15c for connection between the ball portion 15a and the bonded portion 15b (see FIGS. 3 and 6).

Figure 4:
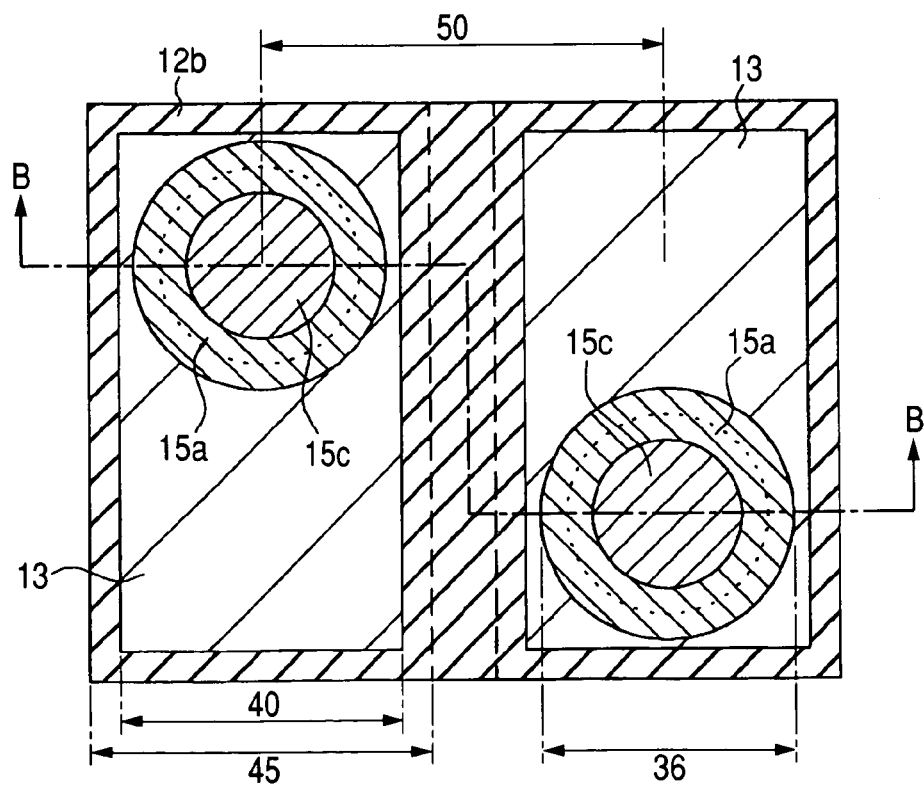
FIG. 4 is a plan view of a principal portion showing electrode pads and the vicinity thereof formed on the semiconductor chip according to the first embodiment of the present invention.

FIG. 3 is a partial enlarged view (sectional view) of electrode pads 13 and the vicinity thereof on the semiconductor chip 3, and FIG. 4 is a plan view of a principal portion. FIG. 3 corresponds to a section taken on line B—B in FIG. 4. In FIG. 3, M indicates a top layer wiring, and this exposed portion serves as an electrode pad 13. The width of the top layer wiring M is about 45 µm. The numerals 12a and 12b each denote an insulating film, of which 12b is a laminate film consisting of, for example, a silicon oxide film and a silicon nitride film.

Figure 5:
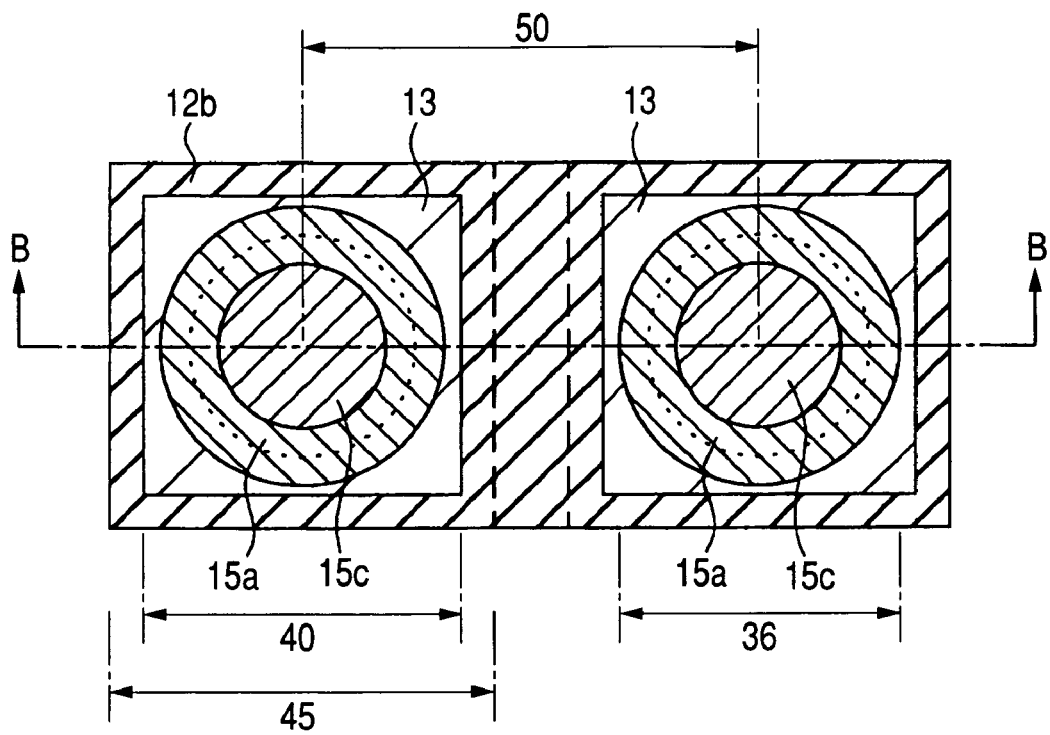
FIG. 5 is a plan view showing the shape of another electrode pad in the semiconductor device according to the first embodiment of the present invention.

As shown in FIG. 4, the electrodes pads 13 each have a rectangular shape with a short-side length of about 40 µm. Although in this embodiment each electrode pad 13 is formed in a rectangular shape because first bonding positions are arranged in a zigzag fashion, the shape of each electrode pad 13 may be, for example, a square shape of about 40 µm square, as shown in FIG. 5.

The pitch of the electrode pads 13 is about 50 µm, as described above. For the bonding on the fine electrode pads 13 arranged at such a narrow pitch, fine gold wires 15 having a diameter of about 20 µm are used.

More specifically, in each gold wire 15, the diameter of the wire portion 15c is about 20 µm and the maximum diameter of the ball portion 15a is about 40 µm (36 µm in this case).

As will be described later, an alloy layer of Al and Au is formed in the bonded portion of both the ball portion 15a and the electrode pad 13, and the bonding is effected through the Al—Au alloy layer.

Figure 7:
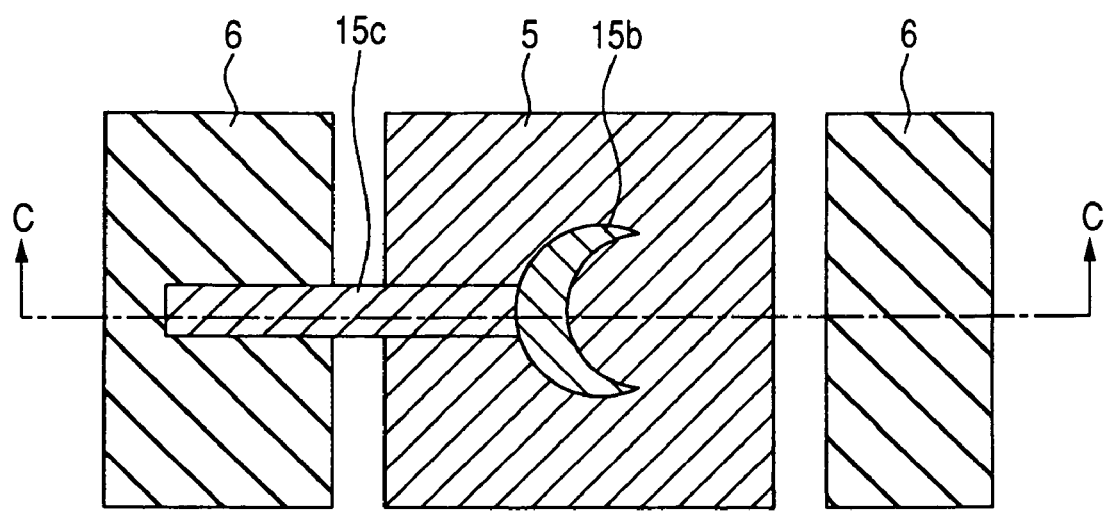
FIG. 7 is a plan view of a principal portion showing an electrode pad and the vicinity thereof formed on the wiring substrate according to the first embodiment of the present invention.

FIG. 6 is a partial enlarged view (sectional view) of an electrode pad 5 and the vicinity thereof on the wiring substrate 1, and FIG. 7 is a plan view of a principal portion. FIG. 6 corresponds to a section taken on line C—C in FIG. 7. The electrode pad 5 comprises copper film 5a, Ni film 5b and Au plated film 5c. The Au plated film 5c is bonded to the gold wire 15, which bonded portion (compression-bonded portion) of the gold wire is designated 15b. Numeral 6 denotes a solder resist ink.

Thus, since a Pd-containing gold wire is used in this embodiment, it is possible to ensure a required bonding strength between the fine electrode pad 13 and the ball portion (compression-bonded ball portion) 15a. The bonding strength can be ensured even if the diameter of the gold wire (wire portion 15c) becomes smaller, as does the maximum diameter of the ball portion 15a.

Since the Pd content in the gold wire is about 1 wt. %, no influence in exerted on the area of bonding between the Au plated film 5c and the gold wire 15 (bonded portion 15b) and the required bonding strength can be ensured. For example, the bonding area in FIG. 7 is equal to that in the use of a Pd-free gold wire. The Pd content is not limited to 1 wt. %, but is preferably in the range of 0.5 to 1.5 wt. %.

As shown in FIG. 2, the semiconductor chip and the gold wires 15 are sealed with a molding resin 17. For example, the molding resin 17 is a thermosetting insulating epoxy resin, into which are added, for example, a phenolic curing agent, silicone rubber and a filler (e.g., silica) for the purpose of diminishing stress. For sealing the semiconductor chip 3, etc. a transfer molding method is used, as will be described later.

Next, the manufacturing steps for fabrication of the semiconductor device according to this embodiment will be described below with reference to FIGS. 8 to 18, in which FIGS. 8 to 11 and FIGS. 13 to 15 are plan views or sectional views of principal portions of a substrate, showing steps in the manufacture of the semiconductor device.

Figure 8:
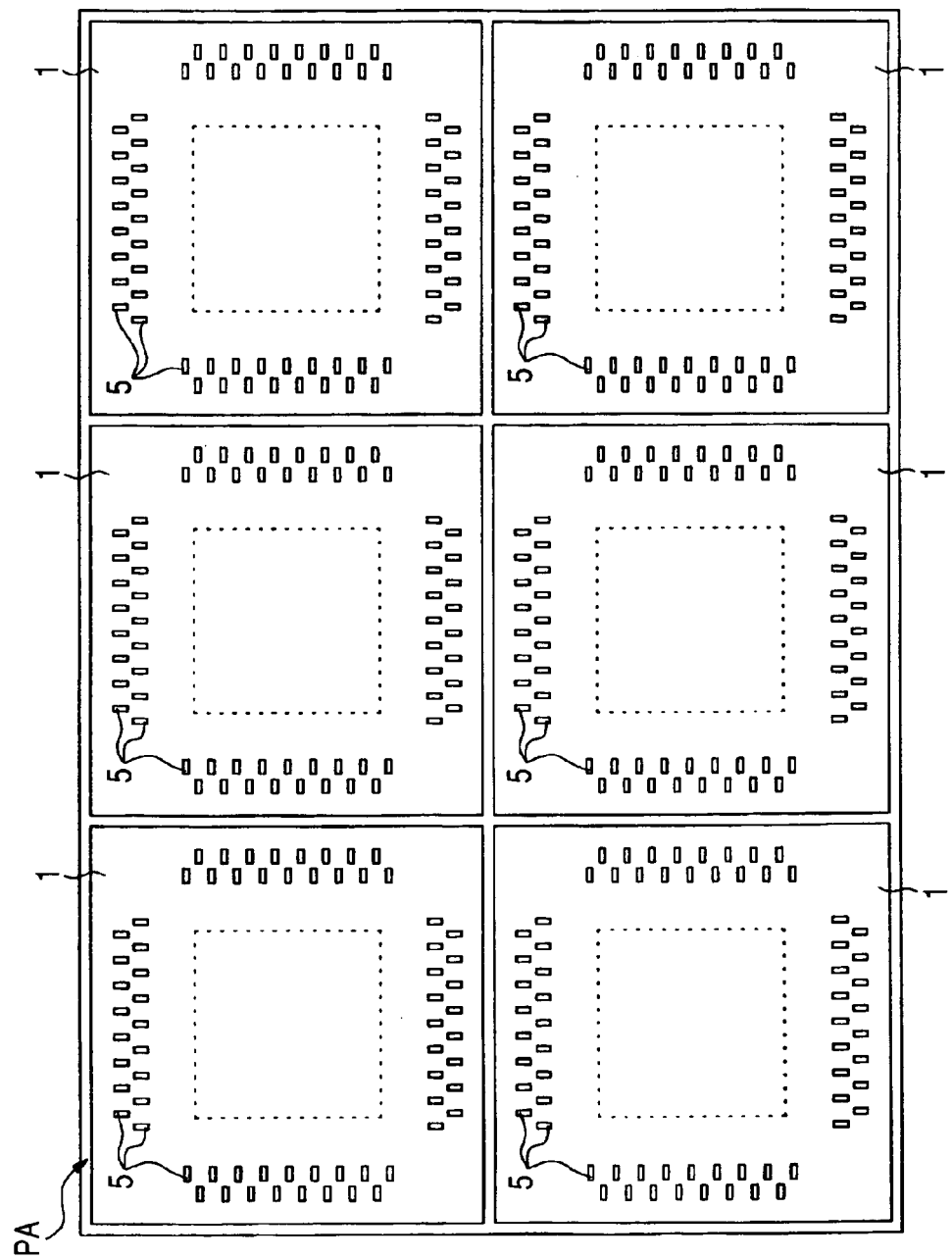
FIG. 8 is a plan view of a principal portion of a substrate, showing a manufacturing step for the semiconductor device according to a first embodiment of the present invention.

As shown in FIG. 8, there are provided a panel PA of plural linked wiring substrates 1 and a plurality of semiconductor chips. At this time point, bump electrodes 9 are not formed yet on the back surface of each wiring substrate 1, but, for example, the electrode pads 7 are exposed.

Figure 9:
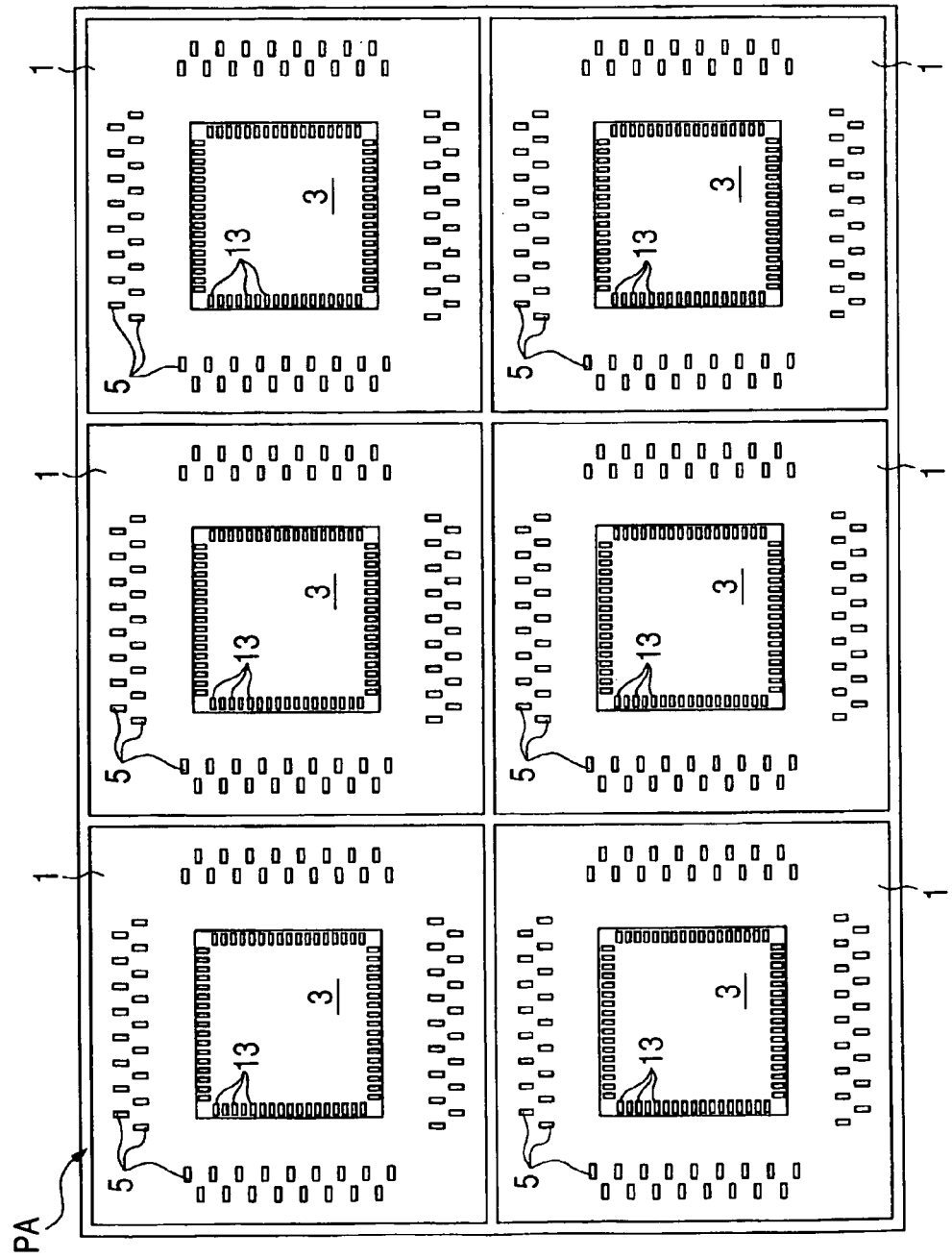
FIG. 9 is a plan view of a principal portion of the substrate, showing a manufacturing step for the semiconductor device according to a first embodiment of the present invention.

Next, as shown in FIG. 9, an adhesive 11 is applied to a chip mounting area (a broken line area in FIG. 8) of each wiring substrate 1, and a semiconductor chip 3 is mounted thereon. The adhesive 11 is cured by heat treatment to fix the semiconductor chip 3.

Figure 10:
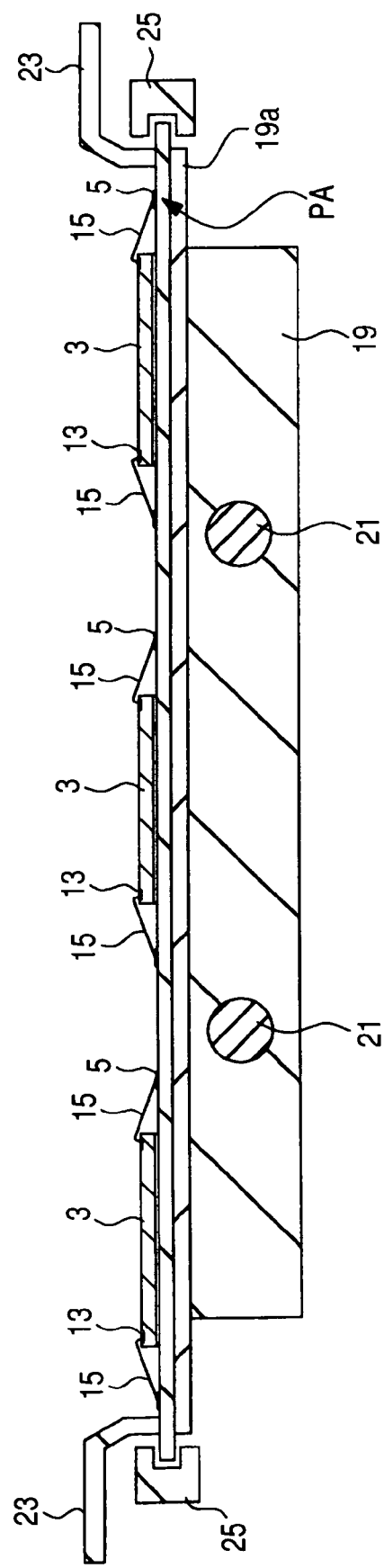
FIG. 10 is a sectional view of a principal portion of the substrate, showing a manufacturing step for the semiconductor device according to a first embodiment of the present invention.

Then, as shown in FIG. 10, the panel PA (wiring substrates 1) is fixed between a heat stage 19a formed of metal or the like on a heat block 19 and a window damper 23. Side portions of the PA are fixed with chutes 25. A heater 21 is built in the heat block 19 and the temperature of the heat block is held at a predetermined temperature by means of a control unit (not shown).

Figure 11:
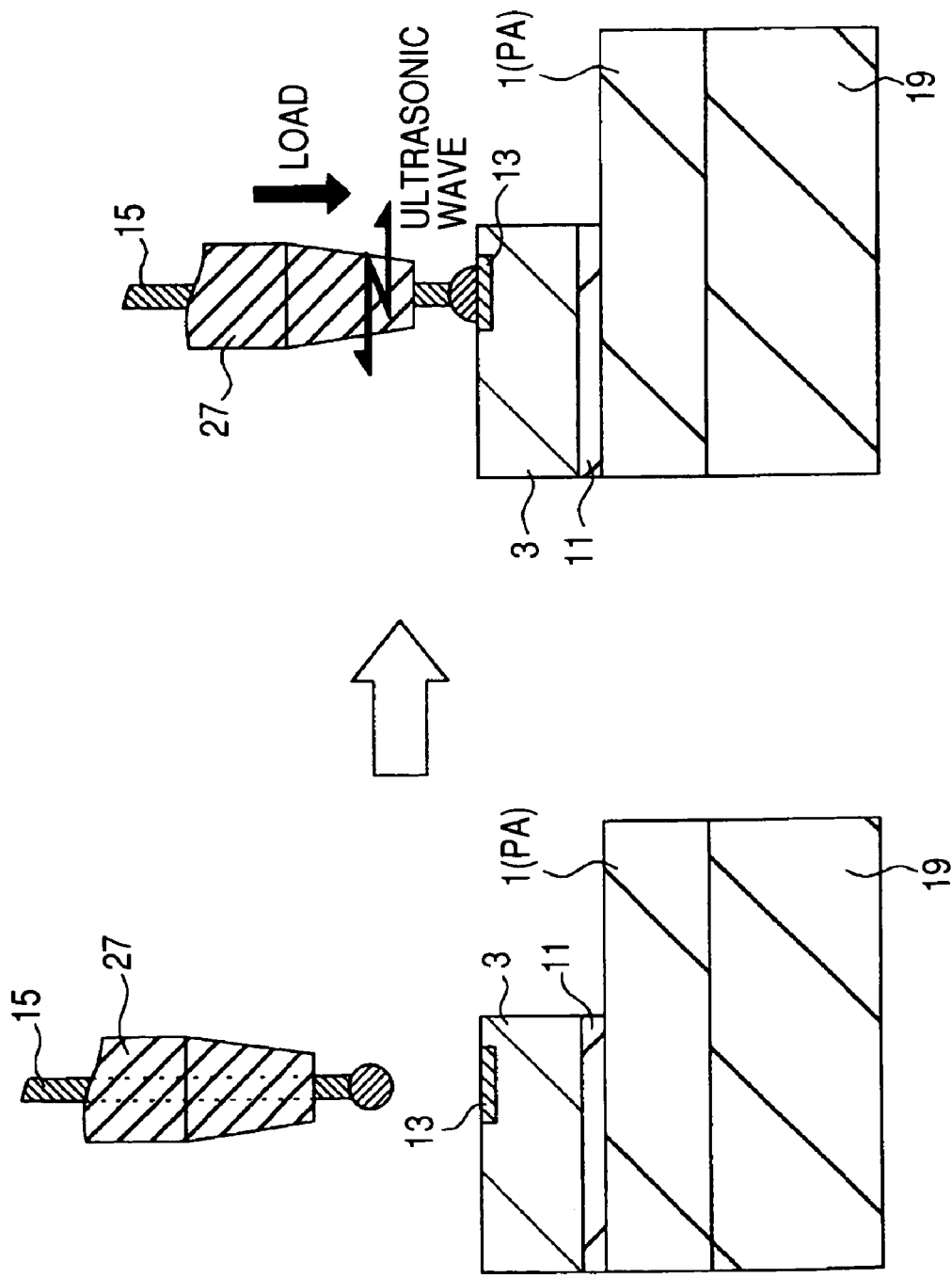
FIG. 11 is a sectional view of a principal portion of the substrate, showing a manufacturing step for the semiconductor device according to a first embodiment of the present invention.

Next, nail head bonding is performed using gold wires 15 which contain Pd. More specifically, as shown in FIG. 11, a gold wire 1 is passed through a capillary 27, and the tip thereof is melted into a ball shape with the use of an electric torch or the like. Next, the ball tip is placed on an electrode pad 13 formed on the semiconductor chip and both are thermocompression-bonded to each other under the application of a certain load by the capillary and under the application of ultrasonic waves (thermosonic wire bonding).

Figure 12:
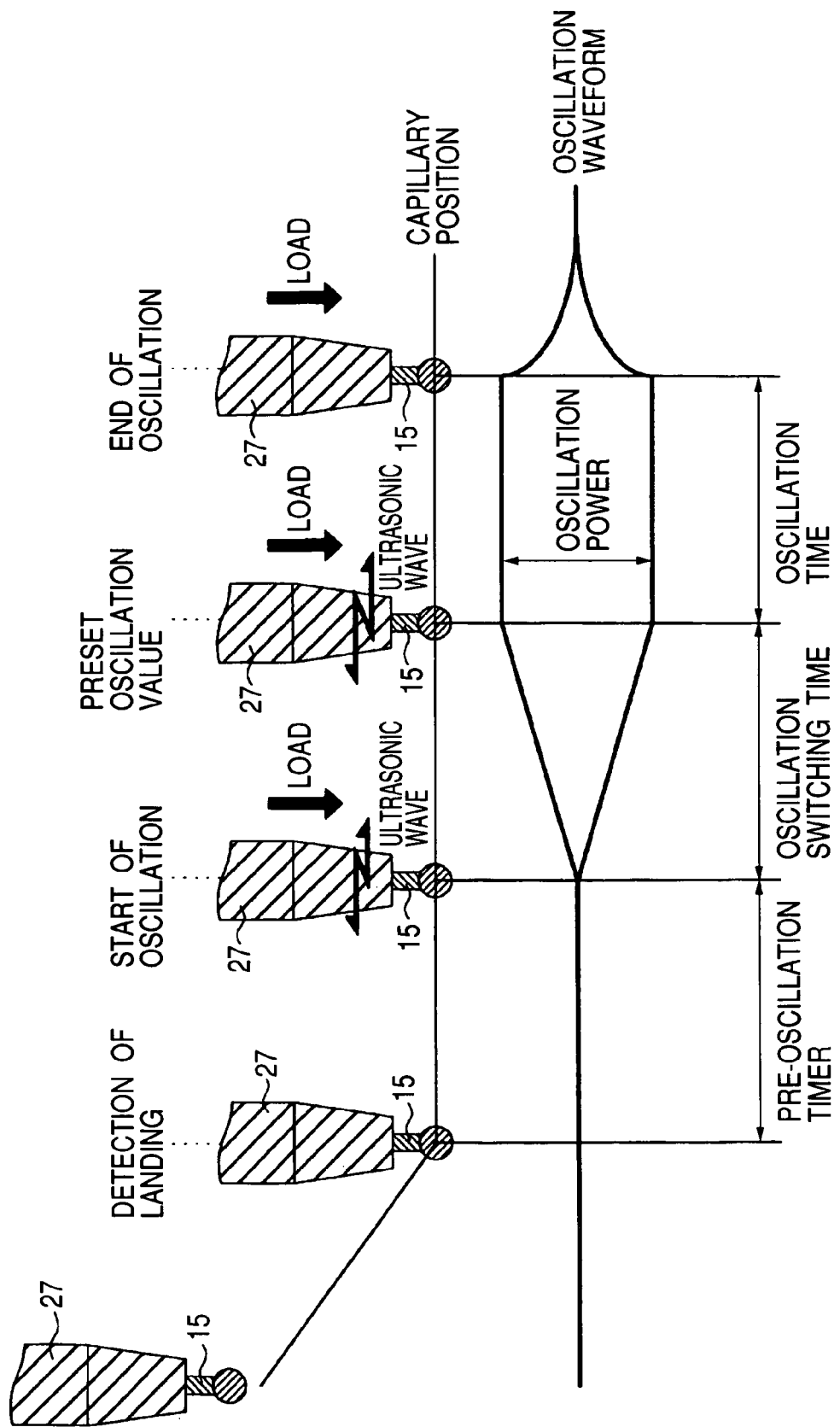
FIG. 12 is a sectional view showing motions of a capillary used in a manufacturing step for the semiconductor device according to a first embodiment of the present invention.

FIG. 12 shows the motions of the capillary. As shown in the same figure, the capillary 27 moves down onto the electrode pad 13; and, upon lapse of a certain period of time (pre-oscillation timer) after the detection of landing, a load is applied and at the same time the oscillation of ultrasonic waves starts. The oscillation increases gradually up to a predetermined oscillation power and is thereafter continued for a certain period of time (oscillation time). Subsequently, the oscillation is terminated and only the load remains. For example, the load is 78.4 mN, the oscillation output of ultrasonic waves is 50 mW, and the oscillation time is 8 msec.

In the case where the pitch of the electrode pads and the maximum diameter of the ball portion are large, the load and output become large. For example, if the pitch is 80 µm and the ball diameter is 58 µm, the load is 196 mN, the oscillation output of ultrasonic waves is 100 mW, and the oscillation time is 15 msec or so. If the pitch is 65 µm and the ball diameter is 50 µm, the load is 147 mN, the oscillation output of ultrasonic waves is 100 mW, and the oscillation time is 15 msec or so.

Then, the capillary 27 is moved to an electrode pad 5 formed on the wiring substrate 1 and the gold wire 15 is thermocompression-bonded onto the electrode pad 5 under the application of ultrasonic waves and the wire is cut off.

Figure 13:
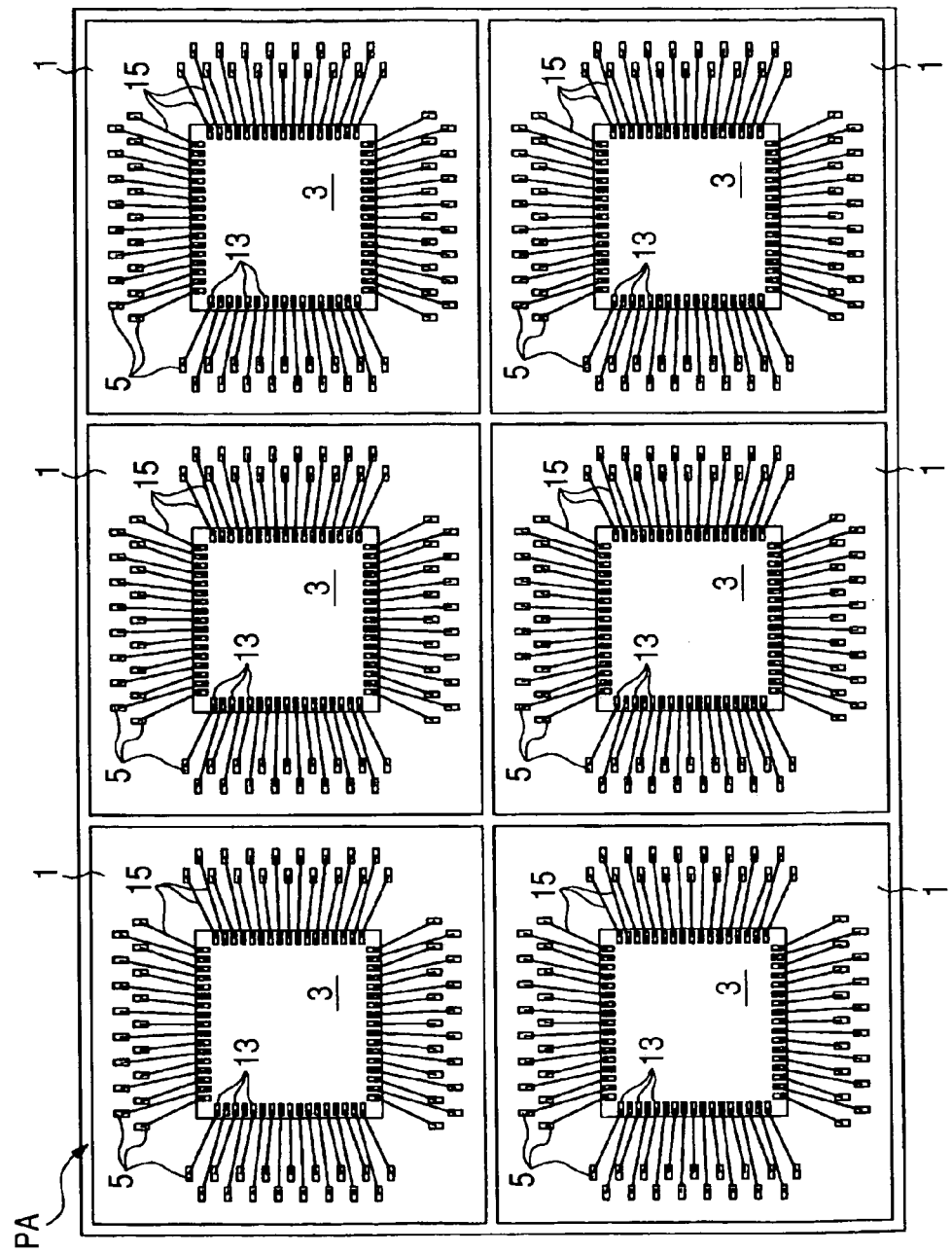
FIG. 13 is a plan view of a principal portion of the substrate, showing a manufacturing step for the semiconductor device according to a first embodiment of the present invention.

By repeating these operations, the electrode pads 13 and 5 are connected with each other through a gold wire 15. As shown in FIG. 13, the first bonding positions may be arranged in a zigzag fashion. Further, adjacent gold wires 15 may be changed in loop height, and the pads spaced by a long distance may be connected by a high loop, while the pads spaced a short distance may be connected by a low loop. In this case, after all of short-distance pads are bonded, the remaining long-distance pads are bonded.

Figure 14:
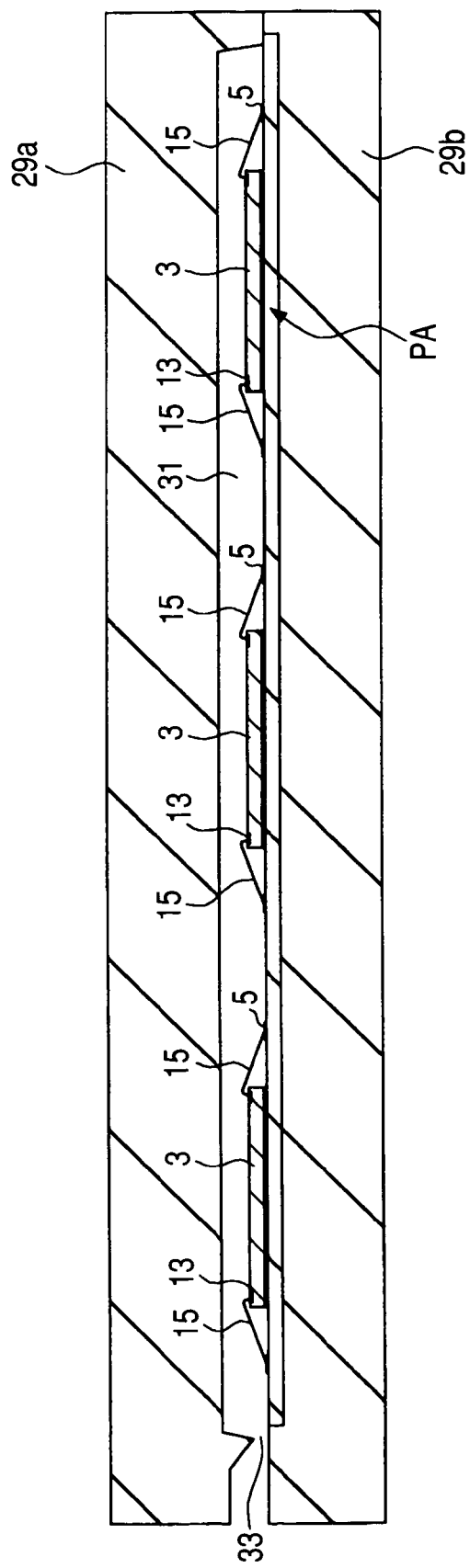
FIG. 14 is a sectional view of a principal portion of the substrate, showing a manufacturing step for the semiconductor device.

Next, as shown in FIG. 14, the panel PA is held grippingly by both an upper die half 29a and a lower die half 29b of a molding die and molten resin is injected into a cavity 31 formed between the upper and lower die halves through an injection gate 33 (transfer molding). As noted earlier, the resin is a thermosetting epoxy resin, for example. Thereafter, the resin is cured and the semiconductor chip 3 is covered with a molding resin 17 from above (see FIG. 2).

Then, bump electrodes 9 are formed using solder or the like on the electrode pads 7 which are formed on the back surface of the panel PA (wiring substrates 1) (see FIG. 2). The bump electrodes 9 are formed by feeding, for example, solder balls onto the electrode pads 7 and subjecting them to a subsequent heat treatment.

Next, the panel PA is cut (diced) for each wiring substrate 1, whereby plural semiconductor devices are formed (see FIG. 2).

In a subsequent product developing process, a PCT (Pressure Cooker Test) is performed for determining whether the life of the devices thus produced is satisfactory or not, namely, for determining whether the characteristics of the devices are good or not. This test is an accelerated test wherein each semiconductor device is allowed to stand in a high-temperature high-humidity condition involving, for example, 2 atm. and 121° C. for a predetermined period of time.

When the semiconductor devices produced in this embodiment were subjected to PCT, no such defect as breaking of wire occurred. Thus, since Pd-containing gold wires are used in this embodiment, a desired bonding strength is ensured even if fine electrode pads arranged at a narrow pitch are subjected to bonding. Besides, even if the wire diameter is small, a desired bonding strength is obtained.

In contrast therewith, when gold wires not containing Pd were used, there occurred breaking of wire (Comparative Test 1). When Pd-free gold wires each having a diameter of 25 µm were bonded to electrode pads arranged at a relatively wide pitch, for example, rectangular electrode pads each having a short side length of 60 µm and a pitch of 65 µm, breaking of wire did not occur (Comparative Test 2). In this case, the maximum diameter of a ball portion 15a was 55 µm.

Figure 15:
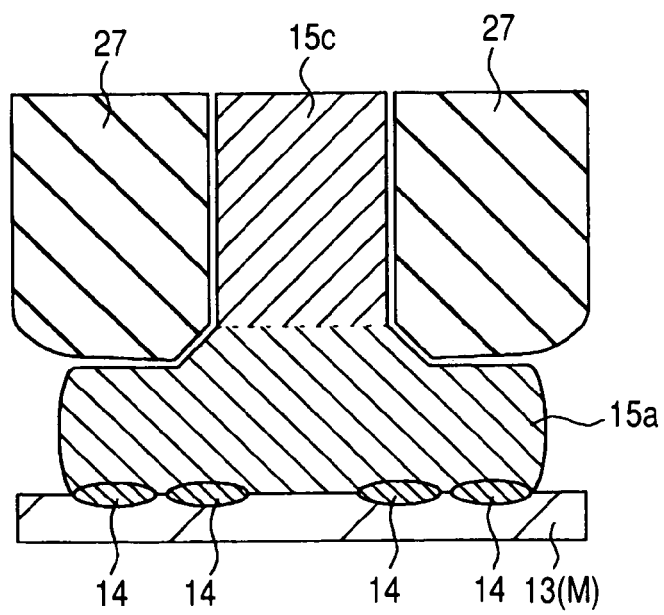
FIG. 15 is a sectional view of a principal portion of the substrate, showing a manufacturing step for the semiconductor device according to a first embodiment of the present invention.
Figure 16:
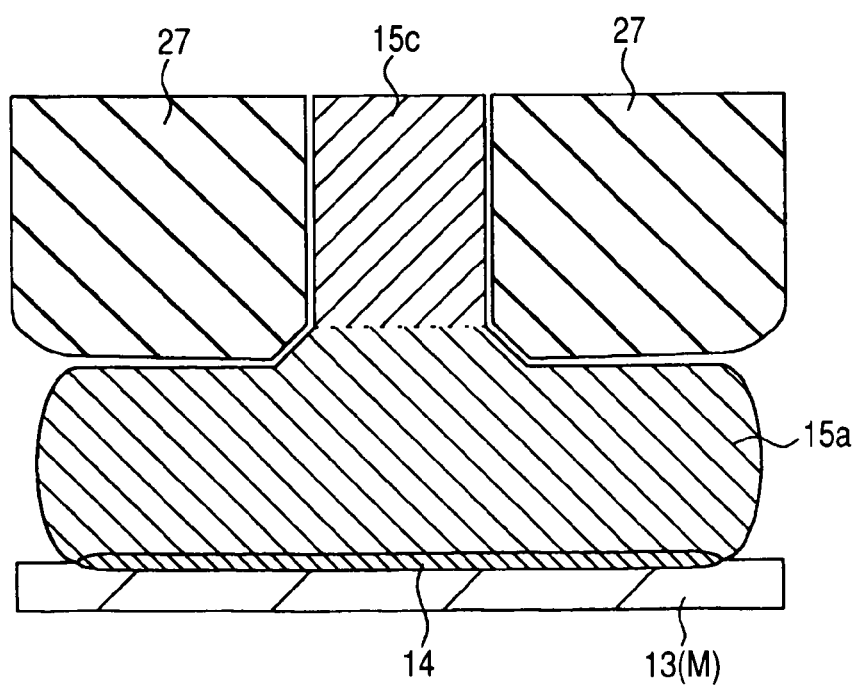
FIG. 16 is a sectional view of a principal portion of the semiconductor device illustrating an effect of the first embodiment.

Thus, as shown in FIG. 15, when Pd-containing gold wires having a small diameter are bonded to fine electrode pads arranged at a narrow pitch, the bonding area is small. Moreover, Al and Au are difficult to be alloyed and non-uniform alloy layers 14 are formed. Further, the wire portion 15c becomes large relative to the ball portion 15a, so that it is difficult to form an Al—Au alloy layer 14 near the center of the ball portion 15a. FIG. 16 shows in what state an alloy layer 14 is formed in case of using a large electrode pad (for example, in the case of the above Comparative Example 2).

Figure 17:
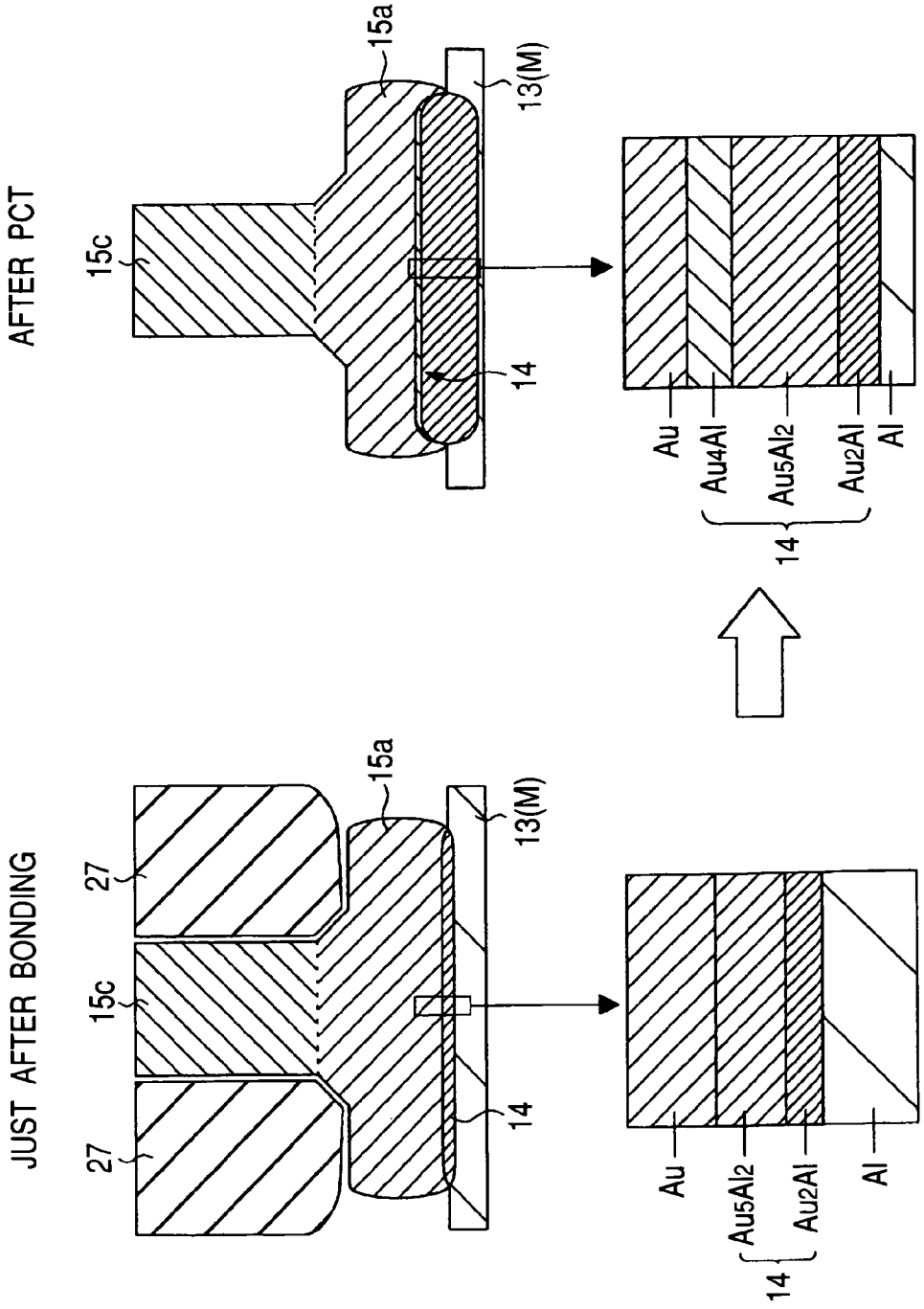
FIG. 17 is a sectional view of a principal portion of the semiconductor device illustration an effect of the first embodiment.

Even in the case where the alloy layer 14 is formed so as to be uniform (for example in the case of the above Comparative Example 1), it turned out that the alloy layer 14 grew in PCT and that $Au_4Al$ having a large proportion of gold (Au) was formed, as shown in FIG. 17.

That is, just after bonding, as shown in FIG. 17, $Au_2Al$ and $Au_5Al_2$ are formed as alloy layers 14 successively from a top layer wiring M (A1) side, and the wire portion 15a (Au) of the gold wire is positioned thereon, but after PCT, alloying proceeds and $Au_4Al$ (an alloy layer having a large proportion of Au relative to Al) is formed between the ball portion 15a (Au) and the $Au_5Al_2$.

The $Au_4Al$ is inferior in adhesion to the $Au_5Al_2$, and it is presumed that peeling occurs in the $Au_4Al$ portion. Besides, the $Au_4Al$ is apt to corrode, particularly in the presence of bromine emitted from the molding resin 17. In the case where corrosion proceeds due to such an external factor, peeling and breaking of wire occur more easily. In the molding resin 17 there is contained an easily bromine-generating solvent which serves as a flame retardant.

Thus, the bonding strength is deteriorated due to the formation of $Au_4Al$, in addition to the reduction of the bonding area.

In the case where each wiring substrate 1 is formed using a glass fabric-based epoxy resin, gas is apt to be produced during bonding. With this gas, the surfaces of the electrode pads 13 are roughened and dust particles adhere thereto, thus causing a lowering of the bonding strength. Also, in case of using a high modulus resin substrate comprising glass fibers that are impregnated with a polyimide resin, gas is apt to occur. The same problem is liable to occur also in case of using a tape (film) substrate containing a polyimide resin.

Figure 18:
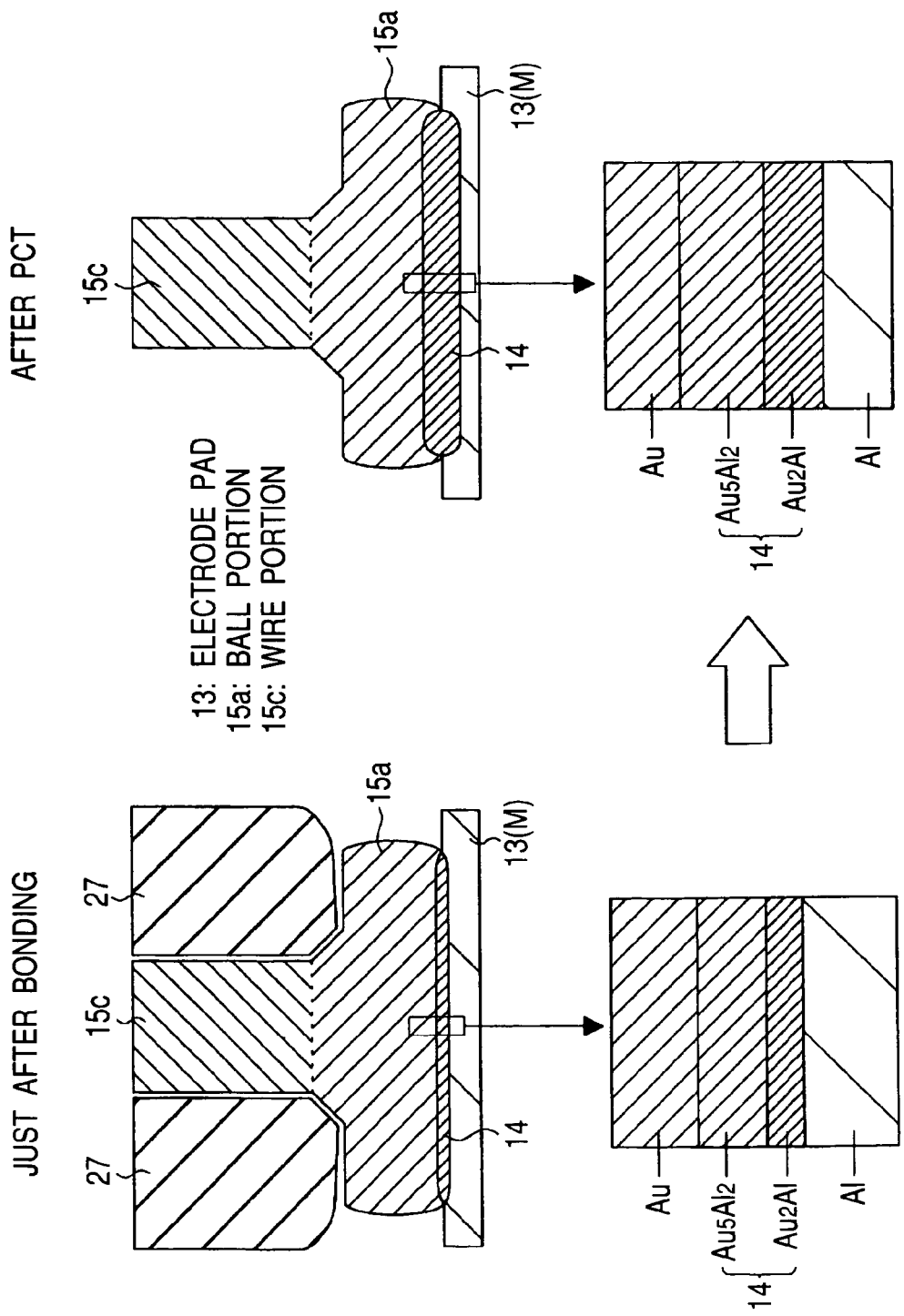
FIG. 18 is a partial enlarged sectional view of an electrode pad and the vicinity thereof on a semiconductor chip just after bonding and after PCT of the semiconductor device according to a first embodiment of the present invention.

On the other hand, since Pd is contained in the gold wire used in this embodiment, interdiffusion of Au and Al is suppressed and $Au_4Al$ is difficult to be formed even after PCT, as shown in FIG. 18. FIG. 18 is a partial enlarged view (sectional view) of an electrode pad 13 and the vicinity thereof formed on the semiconductor chip 3 just after bonding and after PCT of the semiconductor device of this embodiment.

Thus, according to this embodiment, a desired bonding strength of the gold wire can be obtained even in the case where (1) the electrode pad pitch is smaller than 65 µm, (2) the ball portion diameter is smaller than 55 µm and (3) the wire portion diameter is 25 µm or less. That is, the formation of $Au_4Al$ is suppressed, the corrosion resistance is improved, and the breaking of wire caused by the corrosion of $Au_5Al_2$ can be prevented.

Even with further microstructurization, for example, even in the case where (1) the electrode pad pitch is 50 µm or less, (2) the ball portion diameter is 40 µm or less and (3) the wire portion diameter is 20 µm or less, a desired bonding strength of the gold wire can be attained. That is, it is possible to suppress the formation of $Au_4Al$, improve the corrosion resistance, and prevent the breaking of wire caused by corrosion of $Au_5Al_2$.

Second Embodiment

In connection with this embodiment, a description will be given of the case where the film thickness of an electrode pad 13 (the thickness of the top layer wiring M) is 1000 nm or more. For example, the top layer wiring M is often used as a power supply wiring and is sometimes thickened for the purpose of diminishing the wiring resistance.

The semiconductor device of this embodiment is of the same construction as the semiconductor device described in connection with the first embodiment, and it is manufactured in the same manner as in the first embodiment. Therefore, a detailed description thereof will be omitted.

Figure 19:
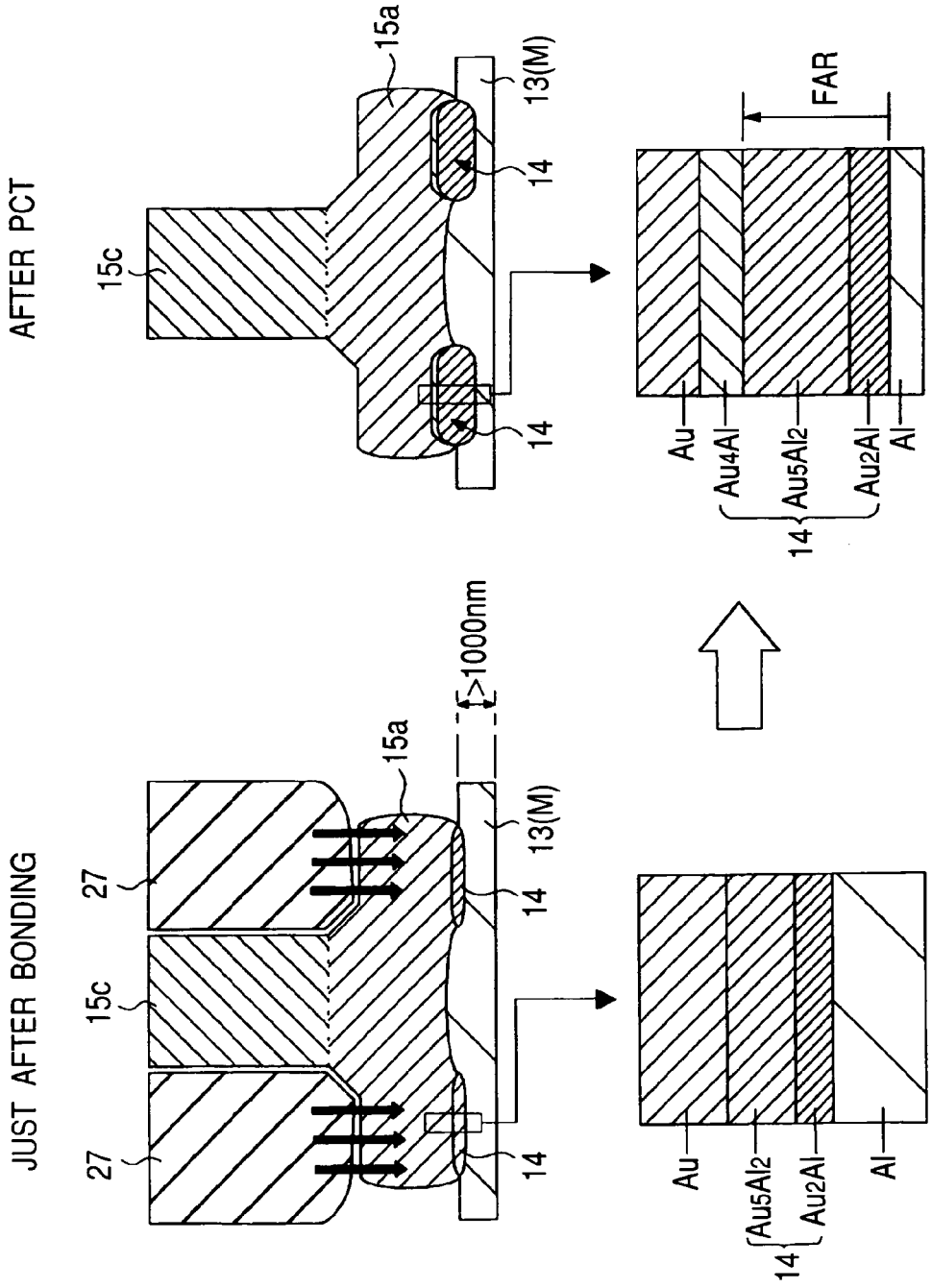
FIG. 19 is a partial enlarged sectional view of an electrode pad and the vicinity thereof in which gold wire not containing Pd is used in a second embodiment of the present invention.
Figure 20:
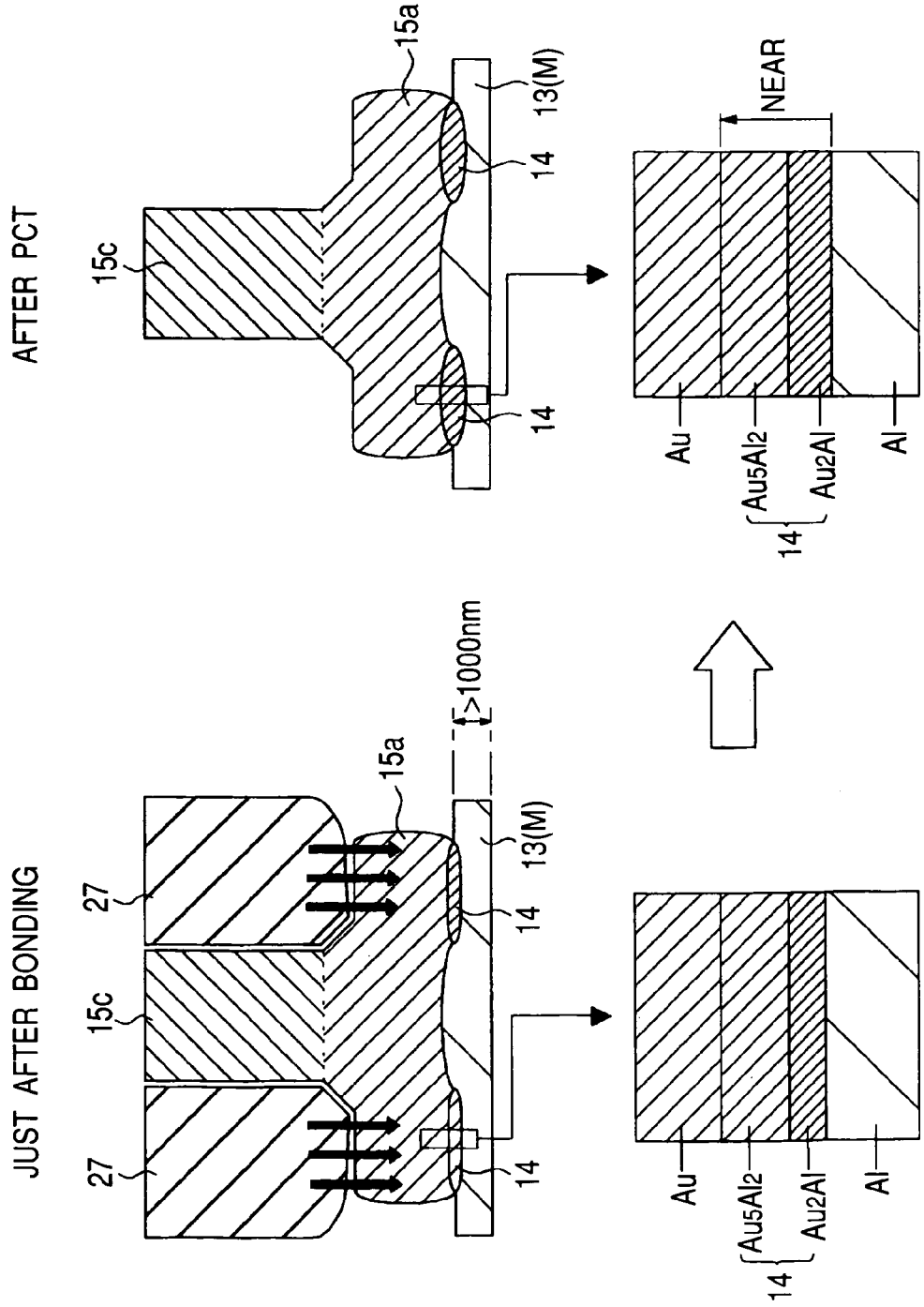
FIG. 20 is a partial enlarged sectional view of an electrode pad and the vicinity thereof on a semiconductor chip just after bonding and after PCT of a semiconductor device according to the second embodiment.

FIG. 19 is a partial enlarged view (sectional view) of an electrode pad 13 and the vicinity thereof in case of using a gold wire 15 (15a, 15b, 15c) not containing Pd, and FIG. 20 is a partial enlarged view (sectional view) of an electrode pad 13 and the vicinity thereof in case of using a gold wire 15 (15a, 15b, 15c) containing Pd.

As shown in FIG. 19, if a Pd-free gold wire is used for an electrode pad having a film thickness of not smaller than 1000 nm, the bonding area becomes small. This is presumed to be because, in the case of a thick electrode pad 13, the pad appears to be soft (so-called cushion effect) in appearance, and, consequently, it is difficult to form an alloy layer 14 at the center of a ball portion not held by the capillary.

Moreover, as explained in connection with the first embodiment, after PCT, $Au_4Al$ is apt to be formed and it is impossible to ensure a desired bonding strength. That is, breaking of wire is apt to occur due to corrosion of $Au_4Al$.

Further, in the alloy layer 14 that is formed, $Au_5Al_2$ is distant from the electrode pad 13, i.e., distant from the Al supply source, so that Al is apt to be removed from the $Au_5Al_2$, which therefore changes into $Au_4Al$ easily.

Therefore, as shown in FIG. 20, in the case where the film thickness of the electrode pad 13 is 1000 nm or more, Pd is incorporated in the gold wire 15 (ball portion 15a) to ensure a desired bonding strength. In this case, interdiffusion of Au and Al is suppressed and $Au_4Al$ is difficult to form even after PCT. As a result, a desired bonding strength can be ensured even if the bonding area becomes smaller. That is, the formation of $Au_4Al$ is suppressed, the corrosion resistance is improved, and breaking of wire caused by $Au_5Al_2$ is prevented.

Moreover, in the alloy layer 14 that is formed, $Au_5Al_2$ is distant from the electrode pad 13, i.e., distant from the Al supply source, and it is therefore difficult to change into $Au_4Al$.

Thus, in this embodiment, a desired bonding strength is obtained even in the case where the film thickness of the electrode pad 13 is 1000 nm or more.

That is, it is possible to suppress the formation of $Au_4Al$, improve the corrosion resistance, and prevent the breaking of wire caused by corrosion of $Au_5Al_2$.

In this embodiment, the shape of the electrode pad is not limited to the one described in connection with the first embodiment. Further, this embodiment is applicable more effectively to a fine, narrow pitch, electrode pad having a thickness of 1000 nm or more as in the first embodiment.

Third Embodiment

In connection with this embodiment, a description will be given of the case where the film thickness of an electrode pad 13 is not larger than 400 nm. With microstructurization of the semiconductor device, the wiring which provides the connection between semiconductor elements also tends to become thinner. For microstructurization, it is desirable that the wiring be thin, for example, that the wiring width be made smaller.

The semiconductor device of this embodiment is the same in both construction and method of manufacture as the semiconductor device described in connection with the first embodiment, and, therefore, a detailed description thereof will be omitted.

Figure 21:
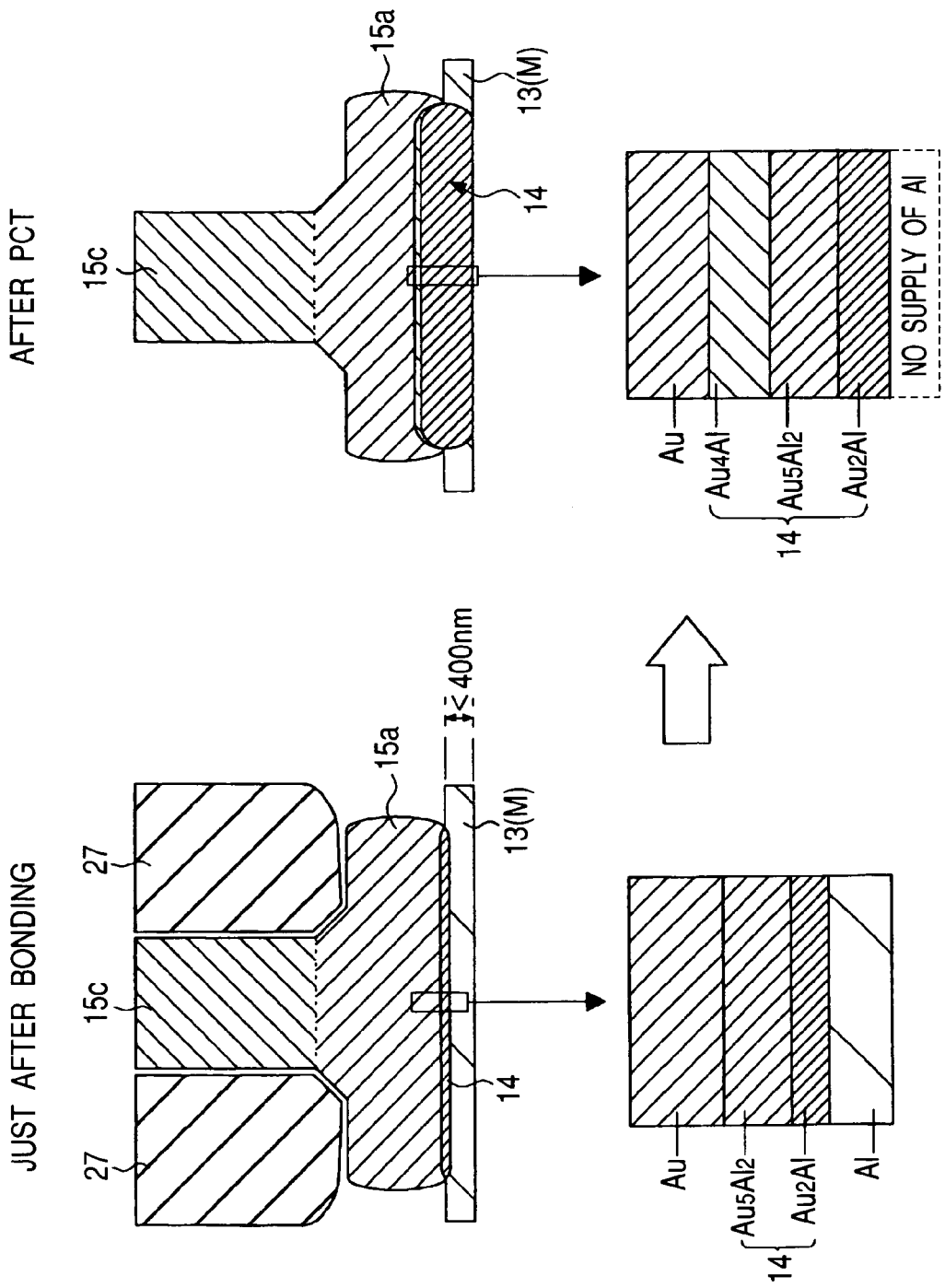
FIG. 21 is a partial enlarged sectional view of an electrode pad and the vicinity thereof in which gold wire not containing Pd is used in a third embodiment of the present invention.
Figure 22:
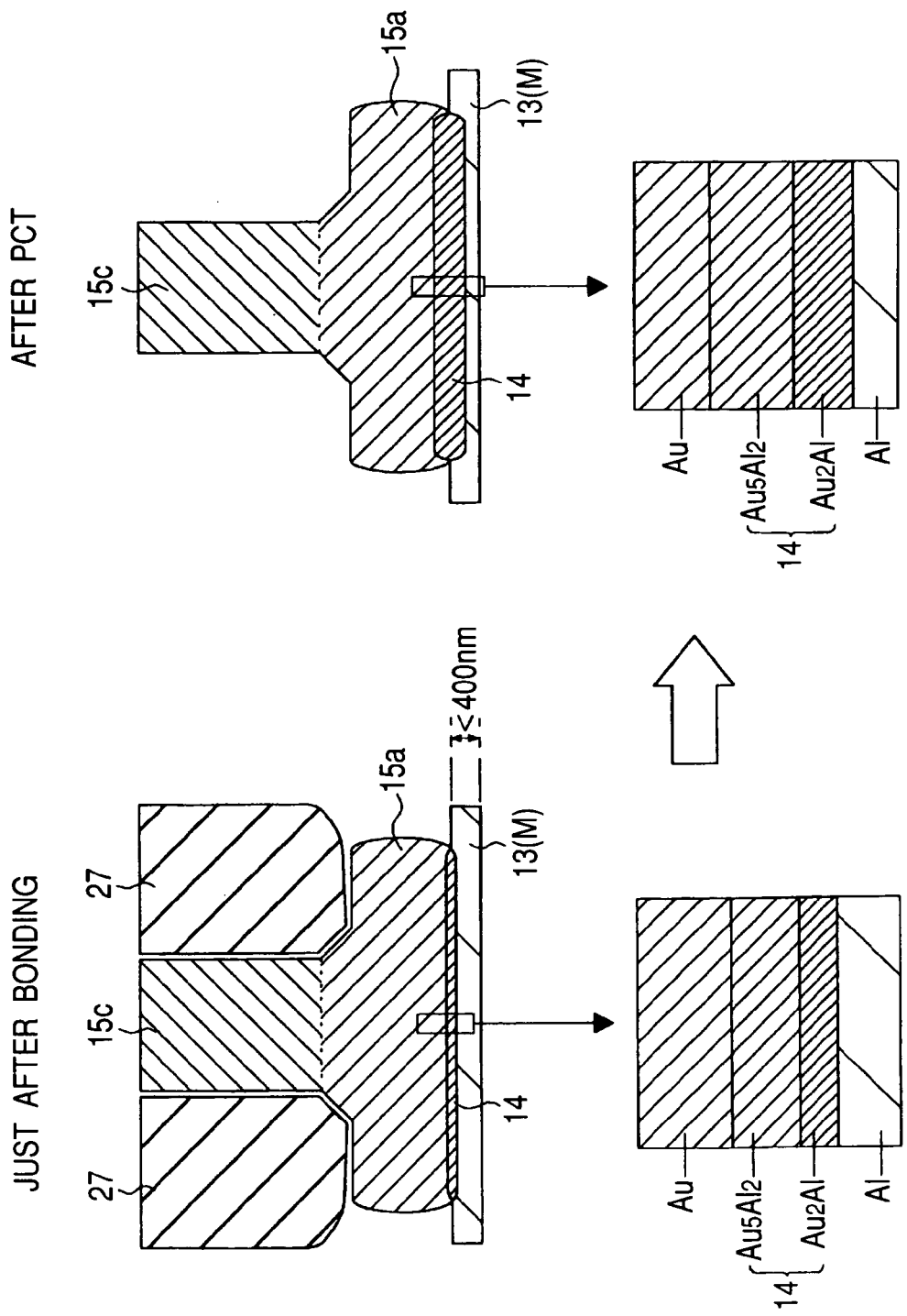
FIG. 22 is a partial enlarged sectional view of an electrode pad and the vicinity thereof on a semiconductor chip just after bonding and after PC of a semiconductor chip according to the third embodiment.

FIG. 21 is a partial enlarged view (sectional view) of an electrode pad and the vicinity thereof in the case of using a gold wire 15 (15a, 15b, 15c) not containing Pd, and FIG. 22 is a partial enlarged view (sectional view) of an electrode pad 13 and the vicinity thereof in the case of using a gold wire 15 (15a, 15b, 15c) containing Pd.

As shown in FIG. 21, in the case where the film thickness of an electrode pad 13 is not larger than 400 nm, if a gold wire not containing Pd is used, an alloy layer 14 grows to a position below a top layer wiring M as a constituent of the electrode pad 13 after PCT. That is, Al is no longer present below a ball portion 15a. As a result, the supply of Al stops, Al is apt to be removed from $Au_5Al_2$, and $Au_4Al$ is easily formed on $Au_5Al_2$.

On the other hand, as shown in FIG. 22, in the case of an electrode pad 13 having a thickness of not smaller than 400 nm, if a Pd-containing gold wire is used for ensuring a desired bonding strength, interdiffusion of Au and Al is suppressed, and $Au_4Al$ is difficult to form even after PCT. That is, the corrosion resistance is improved, and it is possible to prevent the breaking of wire caused by corrosion of $Au_5Al_2$. Further, alloying is suppressed, Al is present below the ball portion and a desired bonding strength is ensured.

Thus, in this embodiment, a desired bonding strength can be ensured even in the case where the film thickness of the electrode pad 13 is not larger than 400 nm. That is, the formation of $Au_4Al$ is suppressed, the corrosion resistance is improved, and the breaking of wire caused by corrosion of $Au_5Al_2$ is prevented.

In this embodiment, the shape of the electrode pad is not limited to the one described in connection with the first embodiment. Further, this embodiment is applicable more effectively to a fine, narrow pitch, electrode pad having a thickness of not larger than 400 nm, as in the first embodiment.

Fourth Embodiment

In connection with this embodiment, a description will be given of the case where the bonding temperature is low (not higher than 200° C.). The bonding temperature indicates a surface temperature of a semiconductor chip or of an electrode pad 13.

As described in connection with the first embodiment, a glass fabric-based epoxy resin degasses when exposed to a high temperature atmosphere.

The gas roughens the surface of the electrode pad 13 and causes the generation of dust particles. For preventing the strain of the panel PA (wiring substrates 1) caused by thermal stress, the bonding temperature tends to become lower.

The semiconductor device of this embodiment is the same in both construction and method of manufacture as the semiconductor device described in connection with the first embodiment, and, therefore, a detailed explanation thereof will be omitted.

Figure 23:
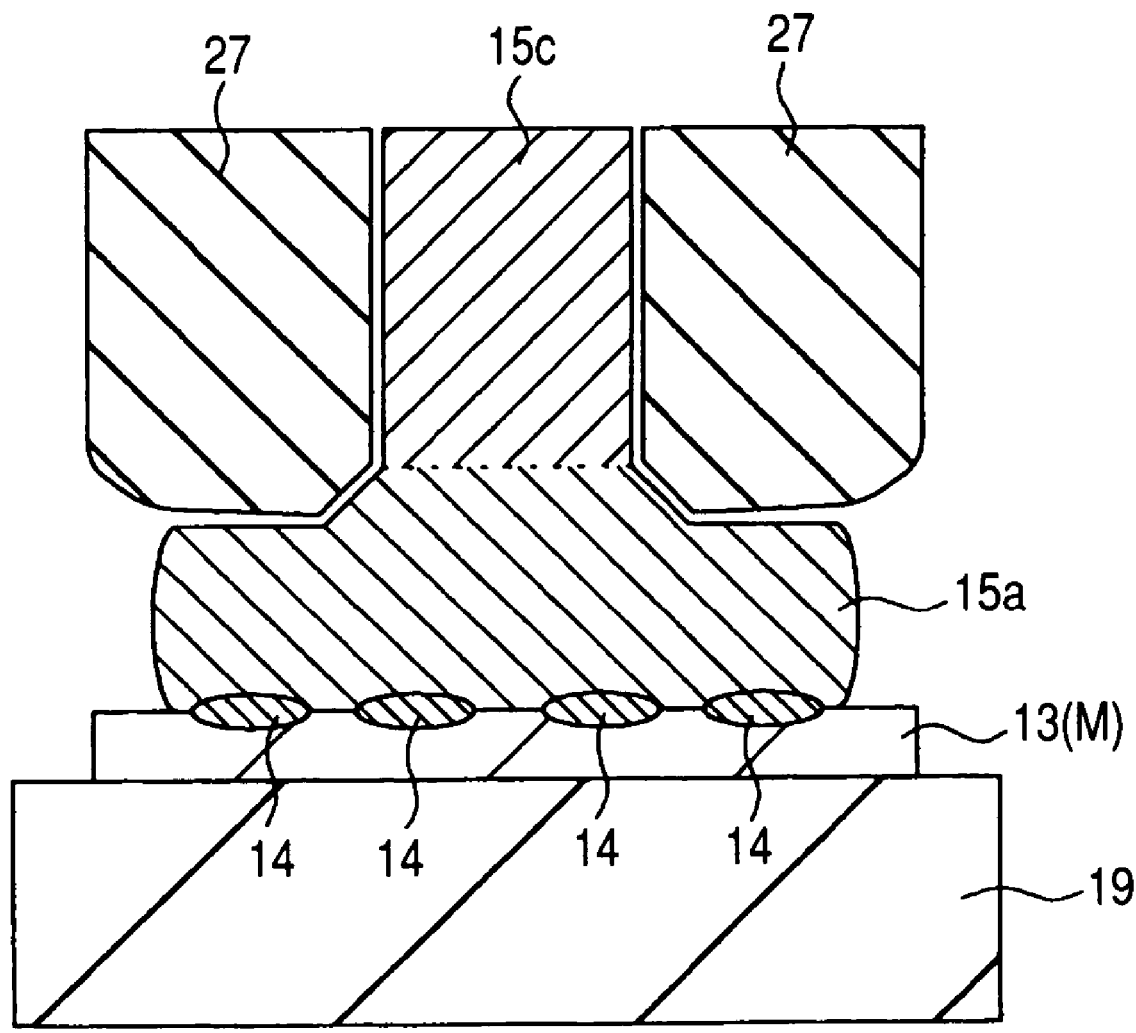
FIG. 23 is a partial enlarged sectional view of an electrode pad and the vicinity thereof, showing a case where the bonding temperature is low.
Figure 24:
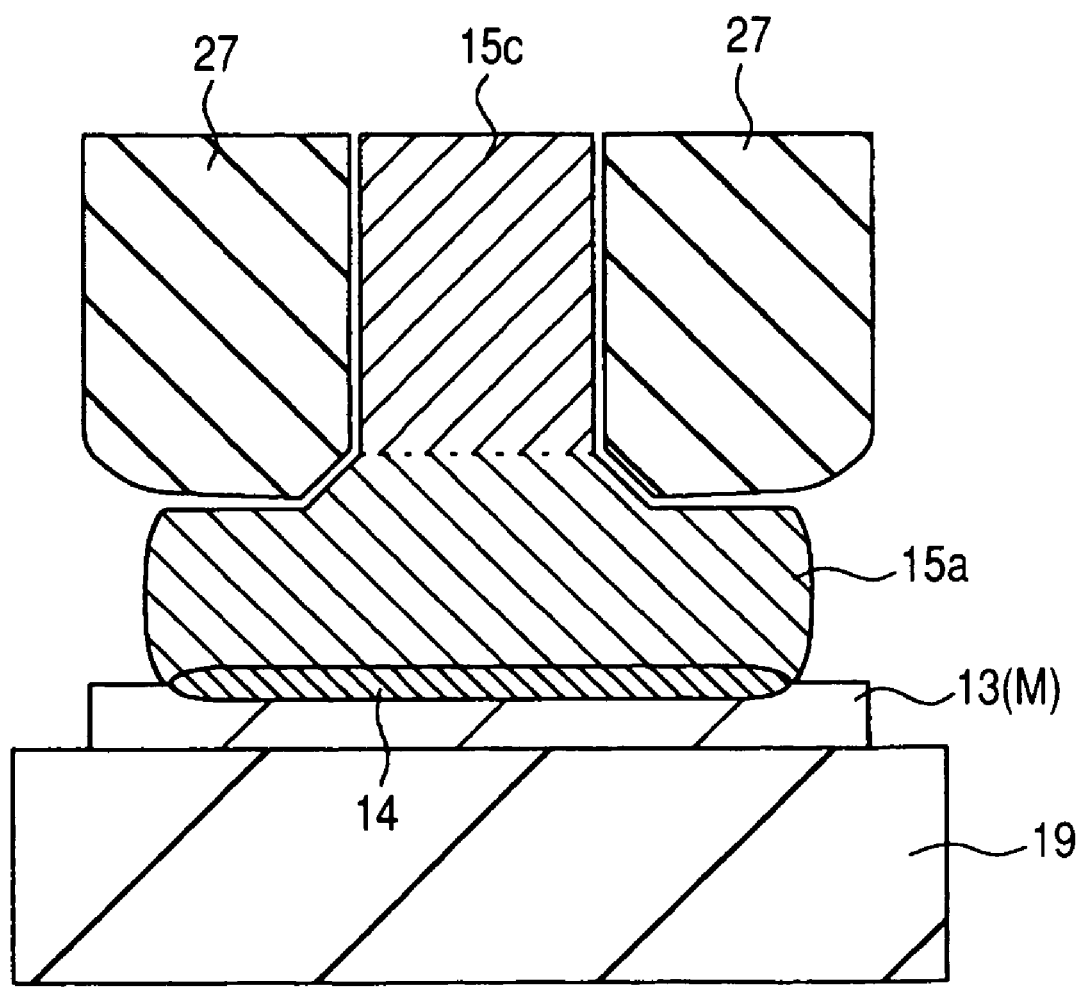
FIG. 24 is a partial enlarged sectional view of an electrode pad and the vicinity thereof, showing a case where the bonding temperature is high.

FIG. 23 is a partial enlarged view (sectional view) of an electrode pad 13 and the vicinity thereof in case of a low bonding temperature, and FIG. 24 is a partial enlarged view (sectional view) of an electrode pad 13 and the vicinity thereof in case of a high bonding temperature. In both figures, the illustration of a heat stage is omitted.

As shown in FIG. 23, in the case where the bonding temperature is not higher than 200° C., for example, the temperature of the heat block 19 is 190° C. and the surface temperature of a semiconductor chip is 150° to 170° C., if there a gold wire 15 (15a, 15b, 15c) not containing Pd is used, the alloying reaction becomes difficult to proceed and the bonding area becomes small. In other words, an alloy layer 14 is not formed on the whole surface of the contact portion between the electrode pad 13 and the ball portion 15a, and a discontinuous (non-uniform) state results.

Further, as described in connection with the first embodiment, if $Au_4Al$ is formed after PCT, it becomes more and more difficult to ensure a desired bonding strength. That is, breaking of wire is apt to occur due to corrosion of $Au_4Al$.

As shown in FIG. 24, if the bonding temperature is high, for example, if the temperature of the heat block 19 is 260° C. and the surface temperature of the semiconductor chip is 240° C. or so, an alloying reaction proceeds, and a desired bonding strength is ensured.

In this embodiment, therefore, Pd was incorporated in a gold wire to ensure a desired bonding strength under the conditions of a bonding temperature of not higher than 200° C., for example, a heat block temperature of 190° C. and a semiconductor chip surface temperature of 150° to 170° C. That is, the formation of $Au_4Al$ was suppressed by incorporating Pd in the gold wire. As a result, the corrosion resistance is improved, and the breaking of wire caused by corrosion of $Au_5Al_2$ is prevented. In other words, interdiffusion of Au and Al is suppressed and $Au_4Al$ is difficult to form even after PCT, whereby it is possible to ensure a desired bonding strength.

In connection with the first embodiment, a description was given to the effect that a Pd-free gold wire having a diameter of 25 μm was bonded to a rectangular electrode pad having a short side length of 60 μm and a pitch of 65 μm. The bonding is performed, for example, at a heat block temperature of 230° C. and a semiconductor chip surface temperature of 200° C.

Thus, in this embodiment, a desired bonding strength is obtained even in the case where the bonding temperature is not higher than 200° C. That is, the formation of $Au_4Al$ is suppressed, the corrosion resistance is improved, and it is possible to prevent the breaking of wire caused by corrosion of $Au_5Al_2$.

In this embodiment, the shape of the electrode pad is not limited to the one described in connection with the first embodiment. Moreover, this embodiment is applicable, more effectively, to the case where fine, narrow pitch electrode pads as in the first embodiment are used, and the bonding temperature (surface temperature of the semiconductor chip) is not higher than 200° C.

Under the condition that the electrode pad thickness is not smaller than 1000 nm or not larger than 400 nm, it will be fairly difficult to ensure a desired bonding strength. In such a case, the application of this embodiment is more effective.

It is preferable that the gold wires used in the second to fourth embodiments each have a Pd concentration of about the same as in the first embodiment.

Although in the above-described embodiments a detailed description has been given with reference to a case where a glass fabric-based epoxy resin is 10 used as the wiring substrate, the present invention is applicable also to the case where there a high modulus resin substrate comprising glass fibers impregnated with a polyimide resin is used, or the case where a tape (film) substrate containing a polyimide resin is used.

Although the present invention has been described specifically by way of various embodiments thereof, it goes without saying that the present invention is not limited to the above-described embodiments, but that various changes may be made within a scope not departing from the gist of the invention.

The conditions described in connection with the above-described embodiments may be suitably combined insofar as the combinations are not contradictory to the gist of the invention.

The following is a brief description of effects obtained by typical modes of the present invention as disclosed herein.

By incorporating Pd in electrically conductive wires containing gold (Au) as a main component, which wires are used for connection between first electrode pads, which appear as exposed areas of a metallic film containing Al as a main component and which are formed on a main surface of a semiconductor chip, and second electrode pads formed on a wiring substrate, a desired bonding strength between the first electrode pads and the electrically conductive wires can be ensured even in the case where the distance between central positions of adjacent first electrode pads is shorter than 65 μm and the diameter of a maximum external form of a ball portion of each wire is smaller than 55 μm or the diameter of a wire portion of each wire is not larger than 25 μm. Also, in the case where the thickness of the metallic film is not smaller than 1000 nm or not larger than 400 nm, it is possible to ensure a desired bonding strength. Likewise, even when the bonding temperature is not higher than 200° C., it is possible to ensure a desired strength. That is, the formation of $Au_4Al$ is suppressed, the corrosion resistance is improved, and it is possible to prevent breaking of wire caused by corrosion of $Au_5Al_2$.

Further, it is possible to improve the reliability and manufacturing yield of the semiconductor device.

What is claimed is:

1. A method of manufacturing a semiconductor device, comprising the steps of:
   (a) providing a wiring substrate having a plurality of second electrode pads formed over a main surface thereof;
   (b) mounting a semiconductor chip over the wiring substrate, the semiconductor chip having over a main surface thereof a plurality of first electrode pads formed as exposed areas of a metallic film which contains aluminum (Al) as a main component; and
   (c) connecting the first electrode pads and the second electrode pads with each other through electrically conductive wires which contain gold (Au) as a main component,
   the step (c) comprising the steps of:
   (c1) melting over the first electrode pads one ends of the electrically conductive wires and bonding the resulting melted balls over the first electrode pads;
   (c2) bonding opposite ends of the electrically conductive wires over the second electrode pads; and
   (c3) forming the electrically conductive wires having ball portions formed over the first electrode pads, bonded portions formed over the second electrode pads, and wire portions for connecting the ball portions and the bonded portions with each other, the ball portions being bonded to the first electrode pads through an alloy layer of Al and Au,
   (d) wherein palladium (Pd) is contained in the electrically conductive wires, and
   (e) wherein the step (c1) is carried out in a state in which the temperature of the main surface of the semiconductor chip is not higher than 200° C.

2. A method according to claim 1, wherein the wiring substrate is formed of a glass fabric-based epoxy resin.

3. A method according to claim 1, further comprising a step of sealing the semiconductor chip and the electrically conductive wire with a molding resin.

4. A method according to claim 1, wherein the wiring substrate is constituted by a resin tape.

5. A method according to claim 1, wherein the distance between central positions of the adjacent first electrode pads is not longer than 50 μm.

6. A method according to claim 1, wherein, the distance between central positions of the adjacent first electrode pads is shorter than 65 μm.

7. A method according to claim 1, wherein, the diameter of a maximum external form of each of the ball portions is smaller than 55 μm.

8. A method according to claim 1, wherein, the diameter of a maximum external form of each of the ball portions is not larger than 40 μm.

9. A method according to claim 1, wherein, the diameter of each of the wire portions is not larger than 25 μm.

10. A method according to claim 1, wherein, the diameter of each of the wire portions is not larger than 20 μm.

11. A method according to claim 1, wherein, the thickness of the metallic film is not smaller than 1000 nm.

12. A method according to claim 1, wherein, the thickness of the metallic film is not larger than 400 nm.

13. A method according to claim 1, wherein, the concentration of the palladium (Pd) contained in the electrically conductive wires is approximately 1 wt. %.

* * * * *